(12) United States Patent
Sugar et al.

(10) Patent No.: US 6,965,762 B2
(45) Date of Patent: *Nov. 15, 2005

(54) SYSTEM AND METHOD FOR ANTENNA DIVERSITY USING JOINT MAXIMAL RATIO COMBINING

(75) Inventors: Gary L. Sugar, Rockville, MD (US); Chandra Vaidyanathan, Bethesda, MD (US); Yohannes Tesfai, Falls Church, VA (US)

(73) Assignee: IPR Licensing, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/695,229

(22) Filed: Oct. 28, 2003

(65) Prior Publication Data

US 2004/0087275 A1 May 6, 2004

Related U.S. Application Data

(63) Continuation of application No. 10/174,728, filed on Jun. 19, 2002, now Pat. No. 6,687,492.
(60) Provisional application No. 60/361,055, filed on Mar. 1, 2002, and provisional application No. 60/365,797, filed on Mar. 21, 2002.

(51) Int. Cl.[7] .......................... H04B 1/06; H04B 7/00; H04B 1/10; H04B 15/00; H04B 17/00
(52) U.S. Cl. .................. 455/276.1; 455/63.1; 455/63.4; 455/69; 455/114.2; 455/67.11; 455/67.16; 455/129
(58) Field of Search ............................... 455/56, 562.1, 455/423, 25, 69, 67.11, 82, 129, 575.7, 63.1, 63.4, 107, 114.2, 289, 279.1, 273, 276.1, 277.1, 277.2, 278.1, 125; 375/347, 295, 148, 267; 342/174, 378, 383

(56) References Cited

U.S. PATENT DOCUMENTS

| 4,121,221 A | 10/1978 | Meadows |
| 4,599,734 A | 7/1986 | Yamamoto .................... 375/40 |

(Continued)

FOREIGN PATENT DOCUMENTS

| WO | WO 02/03568 | 1/2002 |
| WO | WO 01/45300 | 6/2002 |

OTHER PUBLICATIONS

Iserte, Antonio Pascual et al., "Pre–and Post–Beamforming in MIMO Channels Applied to HIPERLAN/2 and OFDM," IST Summit 2001 (IST Mobile Communications Summit), Sep., 2001.

(Continued)

*Primary Examiner*—Vivian Chin
*Assistant Examiner*—Raymond B. Persino
(74) *Attorney, Agent, or Firm*—Volpe and Koenig, P.C.

(57) ABSTRACT

A composite beamforming technique is provided wherein a first communication device has a plurality of antennas and the second communication has a plurality of antennas. When the first communication device transmits to the second communication device, the transmit signal is multiplied by a transmit weight vector for transmission by each the plurality of antennas and the transmit signals are received by the plurality of antennas at the second communication device. The second communication device determines the best receive weight vector for the its antennas, and from that vector, derives a suitable transmit weight vector for transmission on the plurality of antennas back to the first communication device. Several techniques are provided to determine the optimum transmit weight vector and receive weight vector for communication between the first and second communication devices so that there is effectively joint or composite beamforming between the communication devices.

17 Claims, 13 Drawing Sheets

U.S. PATENT DOCUMENTS

| | | |
|---|---|---|
| 4,639,914 A | 1/1987 | Winters .................... 370/110.1 |
| 5,274,844 A | 12/1993 | Harrison et al. .............. 455/25 |
| 5,394,435 A | 2/1995 | Weerackody ............... 375/206 |
| 5,437,055 A | 7/1995 | Wheatley, III ............. 455/33.3 |
| 5,457,808 A | 10/1995 | Osawa et al. |
| 5,491,723 A | 2/1996 | Diepstraten ................. 375/267 |
| 5,493,307 A | 2/1996 | Tsujimoto |
| 5,507,035 A | 4/1996 | Bantz et al. ................. 455/133 |
| 5,539,832 A | 7/1996 | Weinstein et al. |
| 5,570,366 A | 10/1996 | Baker et al. |
| 5,577,265 A | 11/1996 | Wheatley, III |
| 5,610,617 A | 3/1997 | Gans et al. |
| 5,752,173 A | 5/1998 | Tsujimoto |
| 5,761,193 A | 6/1998 | Derango et al. |
| 5,761,237 A | 6/1998 | Petersen et al. |
| 5,812,531 A | 9/1998 | Cheung et al. |
| 5,848,105 A | 12/1998 | Gardner et al. |
| 5,898,679 A | 4/1999 | Brederveld et al. |
| 5,912,921 A | 6/1999 | Warren et al. |
| 5,930,248 A | 7/1999 | Langlet et al. |
| 5,982,327 A | 11/1999 | Vook et al. ................. 342/380 |
| 6,008,760 A | 12/1999 | Shattil |
| 6,023,625 A | 2/2000 | Myers, Jr. |
| 6,037,898 A | 3/2000 | Parish et al. ................. 342/174 |
| 6,038,272 A | 3/2000 | Golden |
| 6,044,120 A | 3/2000 | Bar-David et al. |
| 6,058,105 A | 5/2000 | Hochwald et al. |
| 6,091,934 A | 7/2000 | Berman et al. |
| 6,097,771 A | 8/2000 | Foschini |
| 6,118,788 A | 9/2000 | Kermani et al. |
| 6,122,260 A | 9/2000 | Liu et al. ..................... 370/280 |
| 6,124,824 A | 9/2000 | Xu et al. ..................... 342/174 |
| 6,141,393 A | 10/2000 | Thomas et al. |
| 6,141,567 A | 10/2000 | Youssefmir et al. |
| 6,144,651 A | 11/2000 | Rinchiuso et al. |
| 6,144,711 A | 11/2000 | Raleigh et al. |
| 6,147,985 A | 11/2000 | Bar-David et al. |
| 6,157,340 A | 12/2000 | Xu et al. ..................... 342/174 |
| 6,157,843 A | 12/2000 | Derango et al. |
| 6,177,906 B1 | 1/2001 | Petrus ......................... 342/378 |
| 6,185,440 B1 | 2/2001 | Barratt et al. |
| 6,195,045 B1 | 2/2001 | Xu et al. ..................... 342/368 |
| 6,211,671 B1 | 4/2001 | Shattil |
| 6,252,548 B1 | 6/2001 | Jeon |
| 6,252,884 B1 | 6/2001 | Hunter |
| 6,266,528 B1 | 7/2001 | Farzaneh |
| 6,295,026 B1 | 9/2001 | Chen et al. |
| 6,298,092 B1 | 10/2001 | Heath, Jr. |
| 6,307,882 B1 | 10/2001 | Marzetta |
| 6,317,466 B1 | 11/2001 | Foschini et al. |
| 6,327,310 B1 | 12/2001 | Hochwald et al. |
| 6,331,837 B1 | 12/2001 | Shattil |
| 6,349,219 B1 | 2/2002 | Hochwald et al. |
| 6,351,499 B1 | 2/2002 | Paulraj et al. |
| 6,362,781 B1 | 3/2002 | Thomas et al. |
| 6,369,758 B1 | 4/2002 | Zhang ........................ 342/383 |
| 6,370,182 B2 | 4/2002 | Bierly et al. |
| 6,377,631 B1 | 4/2002 | Raleigh |
| 6,377,636 B1 | 4/2002 | Paulraj et al. |
| 6,377,819 B1 | 4/2002 | Gesbert et al. |
| 6,400,699 B1 | 6/2002 | Airy et al. |
| 6,400,780 B1 | 6/2002 | Rashid-Farrokhi et al. |
| 6,442,214 B1 | 8/2002 | Boleskei et al. |
| 6,462,709 B1 | 10/2002 | Choi |
| 6,463,295 B1 | 10/2002 | Yun |
| 6,473,467 B1 | 10/2002 | Wallace et al. ............. 375/267 |
| 6,522,898 B1 | 2/2003 | Kohno et al. |
| 6,549,786 B2 | 4/2003 | Cheung et al. |
| 6,570,929 B1 | 5/2003 | Eriksson |
| 6,584,161 B2 | 6/2003 | Hottinen et al. |
| 6,636,568 B2 | 10/2003 | Kadous ....................... 375/225 |
| 6,646,600 B2 | 11/2003 | Vail et al. |
| 6,684,064 B2 | 1/2004 | Kazakevich et al. |
| 6,687,492 B1 | 2/2004 | Sugar et al. ............. 455/276.1 |
| 2001/0012764 A1 | 8/2001 | Edwards et al. |
| 2001/0015994 A1 | 8/2001 | Nam |
| 2001/0046255 A1 | 11/2001 | Shattil |
| 2001/0053143 A1 | 12/2001 | Li et al. |
| 2002/0001316 A1 | 1/2002 | Hornsby et al. ............ 370/487 |
| 2002/0024975 A1 | 2/2002 | Hendler |
| 2002/0034191 A1 | 3/2002 | Shattil |
| 2002/0039884 A1 | 4/2002 | Raynes et al. |
| 2002/0064246 A1 | 5/2002 | Kelkar et al. ............... 375/347 |
| 2002/0067309 A1 | 6/2002 | Baker et al. |
| 2002/0072392 A1 | 6/2002 | Awater et al. |
| 2002/0085643 A1 | 7/2002 | Kitchener et al. |
| 2002/0102950 A1 | 8/2002 | Gore et al. |
| 2002/0111142 A1 | 8/2002 | Klimovitch |
| 2002/0118781 A1 | 8/2002 | Thomas et al. |
| 2002/0122383 A1 | 9/2002 | Wu et al. |
| 2002/0122501 A1 | 9/2002 | Awater et al. |
| 2002/0127978 A1 | 9/2002 | Khatri |
| 2002/0136170 A1 | 9/2002 | Struhsaker .................. 370/280 |
| 2002/0141355 A1 | 10/2002 | Struhsaker et al. ......... 370/280 |
| 2002/0147032 A1 | 10/2002 | Yoon et al. |
| 2002/0158801 A1 | 10/2002 | Crilly, Jr. et al. |
| 2002/0159537 A1 | 10/2002 | Crilly, Jr. |
| 2002/0172186 A1 | 11/2002 | Larsson |
| 2002/0172269 A1 | 11/2002 | Xu |
| 2002/0196842 A1 | 12/2002 | Onggosanusi et al. ...... 375/148 |
| 2003/0002450 A1 | 1/2003 | Jalali et al. ................. 370/294 |
| 2003/0022693 A1 | 1/2003 | Gerogiokas et al. |
| 2003/0032423 A1 | 2/2003 | Boros et al. ................. 455/423 |
| 2003/0048761 A1 | 3/2003 | Jarett |
| 2003/0108117 A1 | 6/2003 | Ketchum et al. ........... 375/295 |
| 2003/0114108 A1 | 6/2003 | Frecassetti et al. |
| 2003/0125090 A1 | 7/2003 | Zeira .......................... 455/562 |
| 2003/0139194 A1 | 7/2003 | Onggosanusi et al. ...... 455/506 |
| 2003/0181165 A1 | 9/2003 | Sugar et al. |
| 2004/0072546 A1 | 4/2004 | Sugar et al. |

OTHER PUBLICATIONS

Iserte, Antonio Pascual et al., "Joint Beamforming Strategies in OFDM–MIMO Systems," ICASSP 2002 (IEEE International Conference on Acoustics, Speech and Signal Processing), May, 2002.

Lee, Dennis et al., "Antenna Diversity for an OFDM System in a Fading Channel," Proceeding of IEEE MILCOM 1999, Nov., 1999, pp. 1104–1109.

Jakes, William C., "Microwave Mobile Communications," Copyright 1974, pp. 313–320 and 489–498.

Yeh, Y.S., "An Analysis of Adaptive Retransmission Arrays in a Fading Environment," The Bell System Technical Journal, Oct., 1970, pp. 1811–1825.

Morgan, Samuel P., "Interaction of Adaptive Antenna Arrays in an Arbitrary Environment," The Bell System Technical Journal, Jan., 1965, pp. 23–47.

Aziz, Abdul M.K. et al., "Indoor Throughput and Range Improvements using Standard Compliant AP Antenna Diversity in IEEE 802.11a and ETSI HIPERLAN/2," Vehicular Technology Conference, 2002, VTC 2001, Oct. 7–11, 2001, IEEE VTS 54$^{th}$, vol. 4, pp. 2294–2298.

Iserte, Antonio Pascual et al., "Iterative Algorithm for the Estimation of Distributed Sources Localization Parameters," SSP 2001 (11$^{th}$ IEEE Workshop on Statistical Signal Processing), Aug., 2001.

Vaidyanathan et al., "The Role of Lossless Systems in Modern Digital Signal Processing: A Tutorial," IEEE Transactions on Education, vol. 32, Aug. 1989, pp. 181–197.

Raleigh et al., "Spatio–Temporal Coding for Wireless Communication," IEEE Transactions on Communications, vol. 46., No. 3, Mar. 1998, pp. 357–366.

Jungnickel et al., "Performance of a MIMO System with Overlay Pilots," IEEE GlobeCom 2001, pp. 594–598.

BLAST High–Level Overview, Lucent Technologies, Jul. 18, 2000.

Golden et al., "Detection Algorithm and Initial Laboratory Results Using V–BLAST space–time communication architecture," Electronic Letters, Jan. 7, 1999, vol. 35, No. 1.

Golden et al., "V–BLAST: A High Capacity Space–Time Architecture for the Rich–Scattering Wireless Channel," Bell Laboratories, Lucent Technologies, Proc. Int'l Symposium on Advanced Radio Technologies, Builder, CO, Sep. 10, 1998.

Wolniansky et al., "V–BLAST: An Architecture for Realizing Very High Data Rates Over the Rich–Scattering Wireless Channel," Proc. ISSSE–98, Pisa, Italy, Sep. 29, 1998.

Chizhik et al., "Keyholes, Correlations, and Capacities of Multielement Transmit and Receiver Antennas," IEEE Transactions on Wireless Communications, vol. 1, No. 2, Apr. 2002, pp. 361–368.

Junqiang et al., "Spatial Multiuser Access with MIMO Smart Antennas for OFDM Systems," IEEE VTC '2001, Sep., 2001, pp. 1553–1557.

Stridh et al., "MIMO Channel Capacity on a Measured Indoor Radio Channel at 5.8 GHz," Proc. Of the Asilomar Conf. on Signals, Systems & Computers, vol. 1, Oct., 2000, pp. 733–737.

Jungnickel et al., "A MIMO WLAN Based on Linear Channel Inversion," IEE Seminar–MIMO Communication Systems from Concept to Implementation, Dec., 2001, pp. 20/1–20/6.

Stridh et al., "Spatial Characterization of Indoor Radio Channel Measurements at 5 GHz," SAM '2000, Mar., 2000, pp. 58–62.

Irner, Ralf et al., "MISO Concepts for Frequency–Selective Channels," 2002 International Zurich Seminar on Broadband Communications Access, Feb. 19–21, 2002.

Choi, Ruly Lai–U et al., "MISO CDMA Transmission with Simplified Receiver for Wireless Communication Handsets," IEEE Transactions on Communications, vol. 49, No. 5, May, 2002.

Meyer–Ottens, Sven et al., "Downlink Beamforming for W–CDMA Using Feedback and Interference Estimate," Mar. 9, 2001.

Brunner, Christopher et al., "Downlink Beamforming for WCDMA Based on Uplink Channel Parameters," Proc. EPMCC 1999, pp. 375–380, Mar. 1999.

Yang, Jian et al., "On Joint Transmitter and Receive Optimization for Multiple–Input–Multiple–Output (MIMO) Transmission Systems," IEEE Transactions on Communications, vol. 42, No. 12, Dec., 1994.

Ivrlac, Michel et al., "On Channel Capacity of Correlated MIMO Channels," ITG Fokusprojekt: Mobilkommunikation "Systeme mit intelligenten Antennen", Ilmenau, 2001.

Bablan et al., "Optimum Diversity Combining and Equalization in Digital Data Transmission with Applications to Cellular Mobile Radio–PartII: Numerical Results", May 1992, IEEE Transactions on Communications, vol. 30, No. 5, pp. 895–907.

Chuah et al., "Capacity of Multi–Antenna Array Systems in Indoor Wireless Environment", Nov. 1998, IEEE Globecom.

Wallace et al., "Experimental Characterization of the MIMO Wireless Channel: Data Acquisition and Analysis", Feb. 27, 2002, Department of Electrical and Computer Engineering, Brigham Young University.

Love et al., "Equal Gain Transmission in Multiple–Input Multiple–Output Wireless Systems", Nov. 2002, Proceedings of IEEE Globecom, pp. 1124–1128.

Lucent Technologies, "Lucent Technologies' Chips Poised to Bring "BLAST" Multiple Input/Multiple Output Technology to Laptops, PDAs and Other Mobile Devices," Oct. 16, 2002, lucent.com.

"Lucent's "BLAST" chips to take off in wireless market", Oct. 16, 2002, Semiconductor Business News.

Heath et al., "A Simple Scheme for Transmit Diversity Using Partial Channel Feedback," 1998, IEEE.

Iserte et al., "Pre–and Post–Beamforming in MIMO Channels Applied to HIPERLAN/2 and OFDM", IST Summit 2001, IST Mobile Communications Summit, Sep. 2001.

Iserte et al., "Joint Beamforming Strategies in OFDM–MIMO Systems", ICASSP 2002, IEEE International Conference on Acoustics, Speech and Signal Processing, May 2002.

Lee et al., "Antenna Diversity for an OFDM System in a Fading Channel", Proceeding of IEEE MILCOM 1999, Nov. 1999, pp. 1104–1109.

James, "Microwave Mobile Communications", Copyright 1974, pp. 313–320 and pp. 489–398.

Briesemeister et al., "Role –Based Multicast in Highly Mobile but Sparsely Connect Ad–Hoc Networks", First Annual Workshop on Mobile Ad Hoc Networking & Computing; pp. 45–50; Aug. 2000.

Bablan et al., "Optimum Diversity Combining and Equalization in Digital Data Transmission with Applications to Cellular Mobile Radio–Part II: Numerical Results"; May 1992; IEEE Transactions on Communications, vol. 30, No. 5; pp. 895–907.

Brunner et al., "Downlink Beamforming for WCDMA Based on Uplink Channel Parameters", Proceedings of $3^{rd}$ European Personal Mobile Conference (EPMCC '99), Mar. 1999, pp. 334–339.

Yeh, "An Analysis of Adaptive Retransmission Arrays in a Fading Environment", The Bell System Technical Journal, Oct. 1970, pp. 1811–1825.

Morgan, "Interaction of Adaptive Antenna Arrays in an Arbitrary Environement", The Bell System Technical Journal, Jan. 1965, pp. 23–47.

Stridh et al., "MIMO Channel Capacity on a Measured Indoor Radio Channel at 5.8 GHz", Proc. of the Asilomar Conf. on Signals, Systems & Computers, vol. 1, Oct. 2000, pp. 733–737.

Aziz et al., "Indoor Throughput and Range Improvements Using Standard Complaint AP Antenna Diversity in IEEE 802. 11A and ETSI HIPERLAN/2", Vehicular Technology Conference,, 2002, VTC 2001, Oct. 7–11, 2001, IEEE VTS $54^{th}$ vol. 4, pp. 2294–2298.

Iserte et al., "Iterative Algorithm for the Estimation of Distributed Sources Localizatiion Parameters", SSP 2001, $11^{th}$ IEEE Workshop on Statistical Signal Processing, Aug. 2001.

Vaidyanathan et al., "The Role In Lossless Systems in Modern Digital Signal Processing: A Tutorial", IEEE Transctions on Education, vol. 32, Aug. 1989, pp. 181–197.

Raleigh et al., "Spatio–Temporal Coding for Wireless Communication", IEEE Transactiions on Communications, vol. 48, No. 3, Mar. 1998, pp. 357–366.

Jungnickel et al., "Performance of a MIMO System with Overlay Pilots", IEEE GlobeCom 2001, pp. 594–598.

"Blast High–Level Overview", Lucent Technologyes, Jul. 18, 2000.

Golden et al., "Detection Algorithm and Initial Laboratory Results Using V–BLAST Space–Time Communication Architecture", Electronic Letters, Jan. 7, 1999, vol. 35, No. 1.

Golden et al., "V–BLAST: A High Capacity Space–Time Architecture for th Rich–Scattering Wireless Channel", Bell Laboratories, Lucent Technologies, Proc. Int'l. Symposium on Advanced Radio Technologies, Boulder, CO, Sep. 10, 1998.

Chizhik et al., "Keyholes, Correlations, and Capacities on Multielement Transmit and Receiver Antennas", IEEE Transactions on Wireless Communications, vol. 1, No. 2, Apr. 2002, pp. 361–368.

Junqiang et al., "Spatial Multiuseer Access with MIMO Smart Antennas for OFDM Systems", IEEE VTC 2001, Sep. 2001, pp. 1553–1557.

Jungnickel et al., "A MIMO WLAN Based on Linear Channel Inversion", IEE Seminar–MIMO Communication System from Concept TO Implementation, Dec. 2001, pp. 20/1–20/6.

Stridh et al., "Spatial Characterization of Indoor Radio Channel Measurements at 5 GHz", SAM 2000, Mar. 2000, pp. 58–62.

Imer et al., "MISO Conceptrs for Frequency–Selective Channels", 2002 International Zurich Seminar on Broadband Communications Access, Feb. 19–21, 2002.

Choi et al., "MISO CDMA Transmission with Simplified Receiverfor Wireless Communication Handsets", IEEE Transactions on Communications, vol. 49, No. 5, May 2002.

Meyer–Ottens, et al., "Downlink Beamforming for W–CDMA Using Feedback and Interference Estimate", Mar. 9, 2001.

Brunner, et al., "Downlink Beamforming for WCDMA Based on Uplink Channel Parameters", Proc. EPMCC 1999, pp. 375–380, Mar. 1999.

Yang et al., "On Joint Transmitter and Receive Optimization for Multiple–Input–Multiple–Output (MIMO) Transmission Systems", IEEE Transactions on Communications, vol. 42, No. 12, Dec. 1994.

Ivrlac et al., "On Channel Capacity of Correlated MIMO Channels", ITG Fokusprojekt: Mobilkommunikation Systeme mit Intelligenten Antennen Ilmenau, 2001.

Chuah et al., "Capacity of Multi–Antenna Array Systems in Indoor Wireless Environment", Nov. 1998, IEEE Globecom.

Wallace et al., "Experimental Characterization of the MIMO Wireless Channel: Data Acquisition and Analysis", Feb. 27, 2002, Department of Electricalll and Computer Engineering, Brigham Young University.

Love et al., "Equal Gain Transmission in Multiple–Input Multiple–Output Wireless Systems", Nov. 2002, Proceedings of IEEE Globecom. pp. 1124–1128.

Lucent Technologies, "Lucent Technologies: Chips Poised to Bring 'BLAST'Multiple Input/Multiple Output Technology to Laptops, PDAs and Other Mobile Devices", Oct. 16, 2002, lucent.com.

"Lucent's 'BLAST'Chips to Take Off in Wireless Market", Semiconductor Business News, Oct. 16, 2002.

Heath et al., "A Simple Sheme for Transmit FDiversity Usijg Patial Channel Feedback", Signals, Systems & Computers, Conference Record of the Thirty–Second Asilomar Conference, Nov. 1–4, 1998; vol. 2; pp. 1073–1078.

Chiu ete al., "OFDM Receiver Design", EE225C, Fall 2000, University of California, Berkeley.

Wolnlansky et al., "V–BLAST: An Architecture for Realizing Very High Data Rates Over the Rich–Scattering Wireless Channel", Proc. ISSSE–98, Pisa Italy, Sep. 29, 1998.

Sanchez et al., "CSMA/CA Beam Forming Antennas in Multi–hop Packet Radio"; Proc. For Swedish Workshop on Wireless Ad–Hoc Networks, Mar. 5–6, 2001.

AP side:

$$w_{T,AP,0}(k) = \frac{1}{\sqrt{N_{ap}}}[1,1,\ldots,1]^T$$

$$w_{R,AP,0}(k) = H^T w^*_{T,STA,0}(k)$$

$$w_{T,AP,1}(k) = w^*_{R,AP,0}(k) = \frac{(H^H H) w^*_{T,AP,0}(k)}{\left|(H^H H) w^*_{T,AP,0}(k)\right|}$$

$$w_{T,AP,n}(k) = \frac{(H^H H)^n w^*_{T,AP,0}(k)}{\left|(H^H H)^n w^*_{T,AP,0}(k)\right|}$$

$$w_{R,AP,n}(k) = \frac{(H^T H^*)^{n+1} w^*_{T,AP,0}(k)}{\left|(H^T H^*)^{n+1} w^*_{T,AP,0}(k)\right|}$$

Channel transfers:

- 482: $H(k) w_{T,AP,0}(k)$
- 484: $H^T(k) w_{T,STA,0}(k)$
- 486: $H(k) w_{T,AP,1}(k)$
- 488: $H(k) w_{T,AP,n}(k)$
- 490: $H^T(k) w_{T,STA,n}(k)$

STA side:

$$w_{R,STA,0}(k) = H w_{T,AP,0}(k)$$

$$w_{T,STA,0}(k) = w^*_{R,STA,0}(k) = \frac{H^* w^*_{T,AP,0}(k)}{\left|H^* w^*_{T,AP,0}(k)\right|}$$

$$w_{R,STA,1}(k) = H w_{T,AP,1}(k) = \frac{H(H^H H) w^*_{T,AP,0}(k)}{\left|(H^H H) w^*_{T,AP,0}(k)\right|}$$

$$w_{R,STA,n}(k) = \frac{H(H^H H)^n w^*_{T,AP,0}(k)}{\left|(H^H H)^n w^*_{T,AP,0}(k)\right|}$$

$$w_{T,STA,n}(k) = \frac{H^*(H^T H^*)^n w^*_{T,AP,0}(k)}{\left|H^*(H^T H^*)^n w^*_{T,AP,0}(k)\right|}$$

SYSTEM AND METHOD FOR ANTENNA DIVERSITY USING JOINT MAXIMAL RATIO COMBINING

This application is a continuation of U.S. application Ser. No. 10/174,728, filed Jun. 19, 2002, now U.S. Pat. No. 6,687,492, which in turn claims priority to U.S. Provisional Application No. 60/361,055, filed Mar. 1, 2002 and to U.S. Provisional Application No. 60/365,797 filed Mar. 21, 2002. The entirety of each of these prior applications is incorporated herein by reference.

RELATED APPLICATIONS

This application is related to commonly assigned U.S. Non-Provisional application Ser. No. 10/174,689, filed on even date and entitled "SYSTEM AND METHOD FOR ANTENNA DIVERSITY USING EQUAL POWER JOINT MAXIMAL RATIO COMBINING."

BACKGROUND OF THE INVENTION

The present invention is directed to antenna (spatial) signal processing useful in wireless communication applications, such as short-range wireless applications.

Antenna diversity schemes are well known techniques to improve the performance of radio frequency (RF) communication between two RF devices. Types of antenna diversity schemes include antenna selection diversity and maximal ratio combining. An antenna selection diversity scheme selects one of two antennas for transmission to a particular communication device based on which of the two antennas best received a signal from the particular communication device. On the other hand, maximal ratio combining schemes involve beamforming a signal to be transmitted by two or more antennas by scaling the signal with an antenna weight associated with each antenna. A signal received by a plurality of antennas can also be weighted by a plurality of receive antenna weights. Selection of the antenna weights to optimize communication between two communication devices is critical to the performance of maximal ratio combining schemes.

There is room for improving the maximal ratio combining antenna processing schemes to optimize the link margin between two RF communication devices.

SUMMARY OF THE INVENTION

An antenna signal processing scheme, hereinafter called composite beamforming (CBF), is provided to optimize the range and performance RF communication between two communication devices. Composite beamforming (CBF) is a multiple-input multiple-output (MIMO) antenna scheme that uses antenna signal processing at both ends of the communication link to maximize the signal-to-noise (SNR) and/or signal-to-noise-plus-interference (SNIR), thereby improving the link margin between two communication devices, as well as to provide for other advantages described herein.

Generally, a first communication device has a plurality of antennas and the second communication has a plurality of antennas. The first communication device transmits to the second communication device using a transmit weight vector for transmission by each the plurality of antennas and the transmit signals are received by the plurality of antennas at the second communication device. The second communication device determines the receive weight vector for its antennas, and from that vector, derives a suitable transmit weight vector for transmission on the plurality of antennas back to the first communication device. Several techniques are provided to determine the optimum frequency dependent transmit weight vector and receive weight vector across the bandwidth of a baseband signal transmitted between the first and second communication devices so that there is effectively joint or composite beamforming between the communication devices. The link margin between communication devices is greatly improved using the techniques described herein.

With the same antenna configuration, 2-antenna CBF (2-CBF) provides an SNR improvement of up to 10 dB over transmit/selection diversity when it is used at both ends of the link. A system design using 4 antennas at a first communication device and 2 antennas at a second communication device (hereinafter referred to as 4×2 CBF) provides nearly 14 dB of SNR improvement. In general, for a fixed number of antennas, CBF outperforms the well-known space-time block codes by up to 4 dB. Moreover, unlike space-time coding, CBF does not require a change to an existing wireless standard.

The above and other objects and advantages will become more readily apparent when reference is made to the following description taken in conjunction with the accompanying drawings.

BRIEF DESCRIPTION OF THE DRAWINGS

FIG. 7 is a flow chart illustrating an adaptive algorithm to obtain antenna beamforming weights in a frequency dependent communication channel.

DETAILED DESCRIPTION OF THE DRAWINGS

Figure 1:
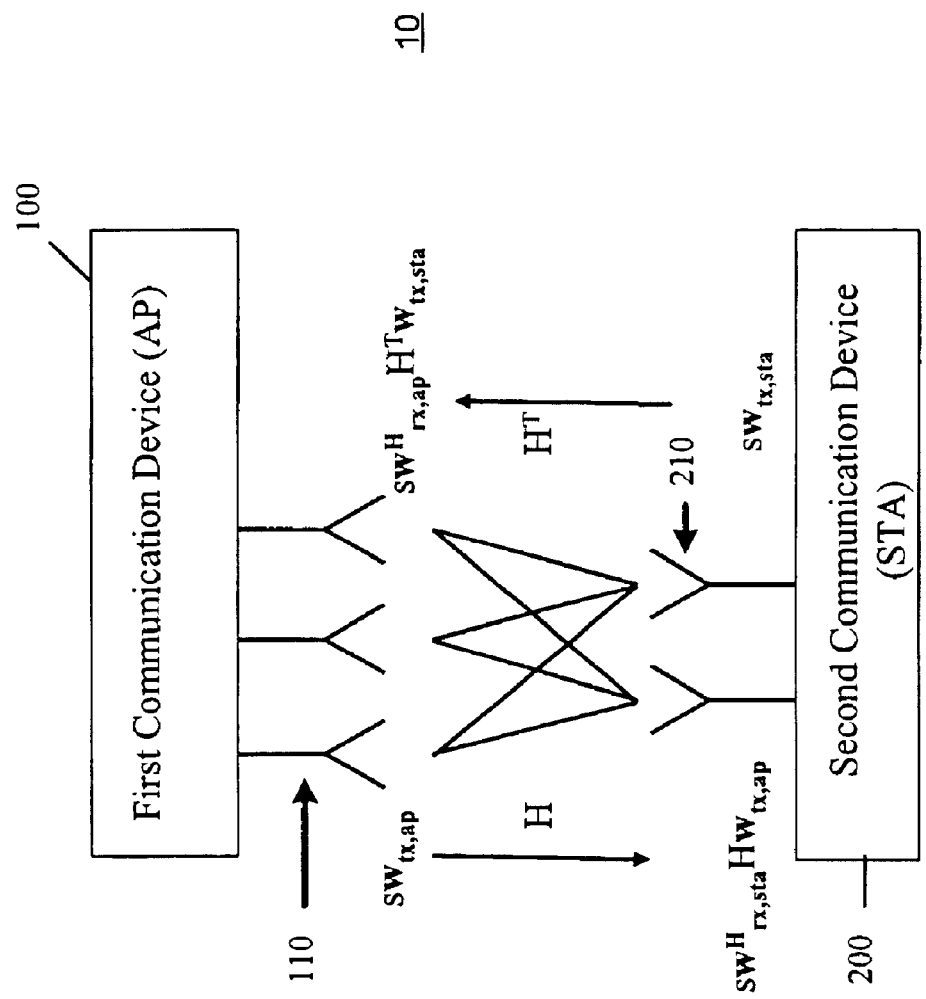
FIG. 1 is a block diagram of two communication devices performing an antenna diversity scheme using composite beamforming.

Referring first to FIG. 1, a system 10 is shown in which a first communication device 100 and a second communication device 200 communicate with each other using radio frequency (RF) communication techniques. The techniques described herein are useful in any radio frequency (RF) communication application, such as short-range wireless applications. A wireless local area network (WLAN) is only an example of an application. For example, device 100 may be an access point (AP) in a WLAN, and device 200 may be a station (STA).

Generally, the device 100 has Nap antennas 110 and the device 200 has Nsta antennas 210. FIG. 1 shows an example where the device 100 has three antennas 110 and the device 200 has two antennas 210. A complex transmit symbol s at device 100 is scaled (multiplied) using a set of complex transmit antenna weights $w_{tx,ap}=[w_0 \ldots w_{Nap-1}]^T$ before being transmitted through respective ones of the antennas 110 ($T$ denotes the transpose operator). The received vector at device 200 is $r_{sta}=sH w_{tx,ap}+n$, where H is an Nsta by Nap channel matrix of unity variance, complex Gaussian random variables (to represent flat Rayleigh fading between each antenna), and n represents noise and interference. At device 200, a combiner $C=(w_{rx,sta})^H r$ is applied, C is passed to a detection circuit (e.g., soft-decision QAM detector, etc.). If H is known at both the transmitter and the receiver, $w_{tx,ap}$ and $w_{rx,sta}$ may be selected to maximize the signal-to-noise ratio (SNR) at the output of the combiner subject to a transmit power constraint, i.e., $(w_{tx,ap})^H w_{tx,ap}=1$.

The SNR for C is maximized over $w_{tx,ap}$ and $w_{rx,sta}$ when $w_{tx,ap}$ is equal to $e_{max}$, the unit norm eigenvector for the maximum eigenvalue $\lambda_{max}$ of the matrix $H^H H$, and $w_{rx,sta}$ is a matched filter for $He_{max}$, i.e., $w_{rx,sta}=k\, He_{max}$ for some nonzero constant k. Under these conditions, the SNR for C is equal to $\lambda_{max}$. Since H is a random matrix, $\lambda_{max}$ is a random variable. The distribution on $\lambda_{max}$ is well known, and can be found in M. Wennstrom, M. Helin, A. Rydberg, T. Oberg, "On the Optimality and Performance of Transmit and Receive Space Diversity in MIMO Channels", IEEE Technical Seminar on MIMO Systems, London, December, 2001, which is incorporated herein by reference.

The transmit device and the receive device communicate using time-division-duplexing at the same frequency. The channel matrix for the reverse link is $H_r=H^T$, and the optimum transmit weight vector $w_{tx,ap}$ is equal to the eigenvector for the maximum eigenvalue of $H_r^H H_r=H^* H^T$ (* denotes the conjugate operator). The maximum SNR at either end of the link is the same (since it is a well known result that the nonzero eigenvalues for both $H^* H^T$ and $H^H H$ are the same). The beamforming technique that results from this analysis is hereinafter referred to as composite beamforming (CBF).

Figure 2:
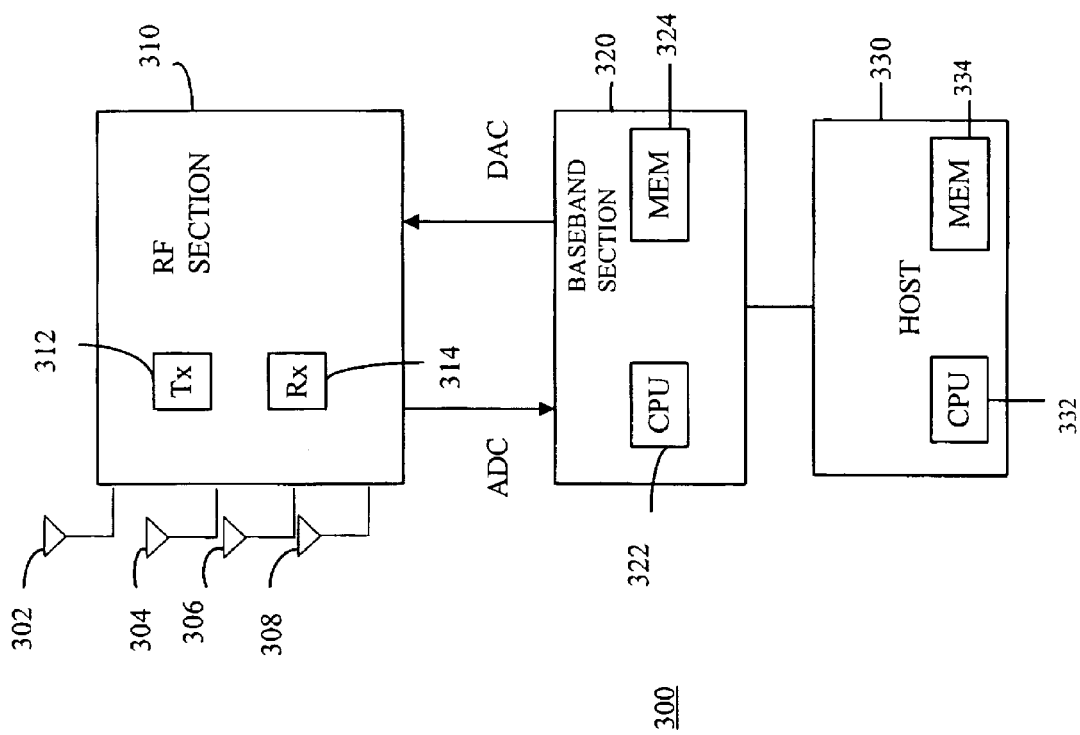
FIG. 2 is a block diagram of a communication device that may be used at either end of a composite beamforming communication link.

The communication devices at both ends of the link, i.e., devices 100 and 200 may have any known suitable architecture to transmit, receive and process signals. An example of a communication device block diagram is shown in FIG. 2. The communication device 300 comprises an RF section 310, a baseband section 420 and optionally a host 330. There are a plurality of antennas, e.g., four antennas 302, 304, 306, 308 coupled to the RF section 310 that are used for transmission and reception. The RF section 310 has a transmitter (Tx) 312 that upconverts baseband signals for transmission, and a receiver (Rx) 314 that downconverts received RF signals for baseband processing. In the context of the composite beamforming techniques described herein, the Tx 312 upconverts and supplies separately weighted signals to corresponding ones of each of the plurality of antennas via separate power amplifiers. Similarly, the Rx 314 downconverts and supplies received signals from each of the plurality of antennas to the baseband section 320. The baseband section 320 performs processing of baseband signals to recover the information from a received signal, and to convert information in preparation for transmission. The baseband section 320 may implement any of a variety of communication formats or standards, such as WLAN standards IEEE 802.11x, Bluetooth™, as well as other protocol standards, not necessarily used in a WLAN.

The intelligence to execute the computations for the composite beamforming techniques described herein may be implemented in a variety of ways. For example, a processor 322 in the baseband section 320 may execute instructions encoded on a processor readable memory 324 (RAM, ROM, EEPROM, etc.) that cause the processor 322 to perform the composite beamforming steps described herein. Alternatively, an application specific integrated circuit (ASIC) configured with the appropriate firmware, e.g., field programmable gates that implement digital signal processing instructions to perform the composite beamforming steps. This ASIC may be part of, or the entirety of, the baseband section 320. Still another alternative is for the beamforming computations to be performed by a host processor 332 (in the host 330) by executing instructions stored in (or encoded on) a processor readable memory 334. The RF section 310 may be embodied by one integrated circuit, and the baseband section 320 may be embodied by another integrated circuit. The communication device on each end of the communication link need not have the same device architecture or implementation.

Regardless of the specific implementation chosen, the composite beamforming process is generally performed as follows. A transmit weight vector (comprising a plurality of complex transmit antenna weights corresponding to the number of transmit antennas) is applied to, i.e., multiplied by, a baseband signal to be transmitted, and each resulting weighted signal is coupled to a transmitter where it is upconverted, amplified and coupled to a corresponding one of the transmit antennas for simultaneous transmission. At the communication device on the other end of the link, the transmit signals are detected at each of the plurality of antennas and downconverted to a baseband signal. Each baseband signal is multiplied by a corresponding one of the complex receive antenna weights and combined to form a resulting receive signal. The architecture of the RF section necessary to accommodate the beamforming techniques described herein may vary with a particular RF design, and many are known in the art and thus is not described herein.

Figure 3:
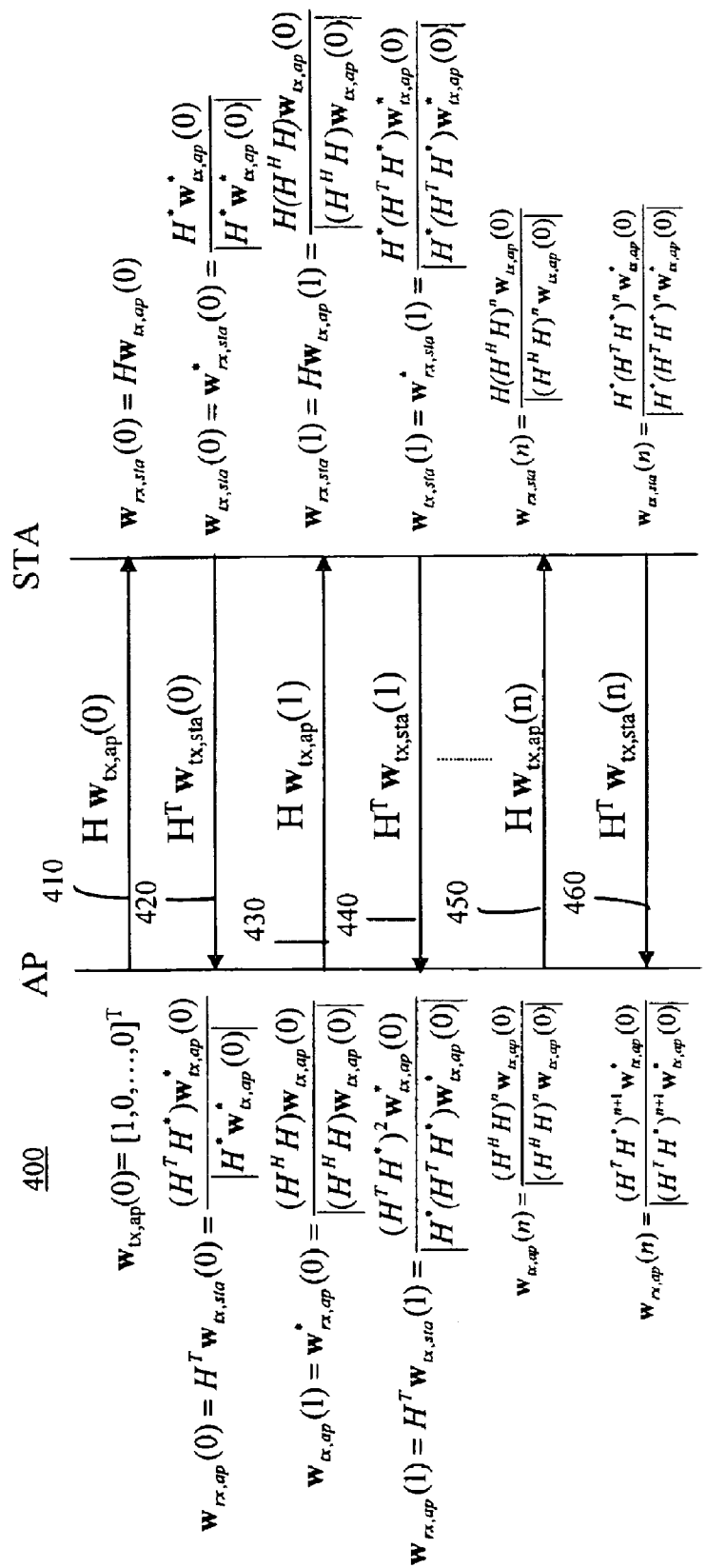
FIG. 3 is a flow chart illustrating an adaptive method to obtain antenna beamforming weights for communication between first and second communication devices.

Turning to FIG. 3, a process 400 is shown for achieving optimum CBF between two communication devices. To restate the results from the previous discussion, the optimum receive and transmit weights at the AP are given by $w_{rx,ap}=e_{max}$(of $H^H H$), $w_{tx,ap}=w_{rx,ap}*$. The optimum receive and transmit weights at the STA are given by $w_{rx,sta}=e_{max}$(of $H^* H^T$), $w_{tx,sta}=w_{rx,sta}*$. Additionally, $w_{rx,sta}=Hw_{tx,ap}$, $w_{rx,ap}=H^T w_{tx,ap}$. These properties can be utilized to design an adaptive/iterative algorithm that converges to the optimum eigenvector as follows.

Initially, in step 410, the AP uses an arbitrary set of transmit antenna weights to transmit a signal to the STA. When the STA receives the signal, the receive antenna weights at the STA are matched to the receive signal such that $w_{rx,sta}(0)=Hw_{tx,ap}(0)$ That is, the STA receive antenna weights are computed from the received signals at each of the antennas by matching to the received signals. In step 420, the STA computes the conjugate of the receive weight vector made up of the receive antenna weights for use as the transmit antenna weight vector for transmitting on the STA's antennas back to the AP. The AP receives the signal transmitted by the plurality of antennas of the STA and matches the receive antenna weights to the received signal.

In step 430, the AP updates the new transmit antenna weights by computing the conjugate of the receive weight vector (comprised of the AP receive antenna weights) divided by the norm of the AP receive weight vector. This process repeats in steps 440 through 460, ad infinitum. It can be shown that the weights converge to the eigenvector corresponding to the maximum eigenvalue. See G. Golub, C. V. Loan, "Matrix Computations", 2nd edition, pp. 351.

Within a few iterations, the transmit weight vector and receive antenna weight vector of both devices will converge to values that optimize the SNR at each of the devices. At such point, the first communication device may store in a memory (in the baseband section or host processor section) the current optimum transmit antenna weights for a particular destination communication device indexed against an identifier for that communication device. The first communication device, such as an AP, may store in a look-up-table optimum transmit antenna weights indexed against corresponding identifiers (such as MAC addresses) for a plurality of other communication devices it communicates with.

The adaptive process of FIG. 3 will converge to optimum antenna weights even if one device has multiple antennas and can weight signals supplied thereto, and the other device is a merely a single antenna device. The device on the link with the multiple antennas and combining capability can still converge to its optimum transmit and receive weights for a single antenna device it communicates with.

Figure 4:
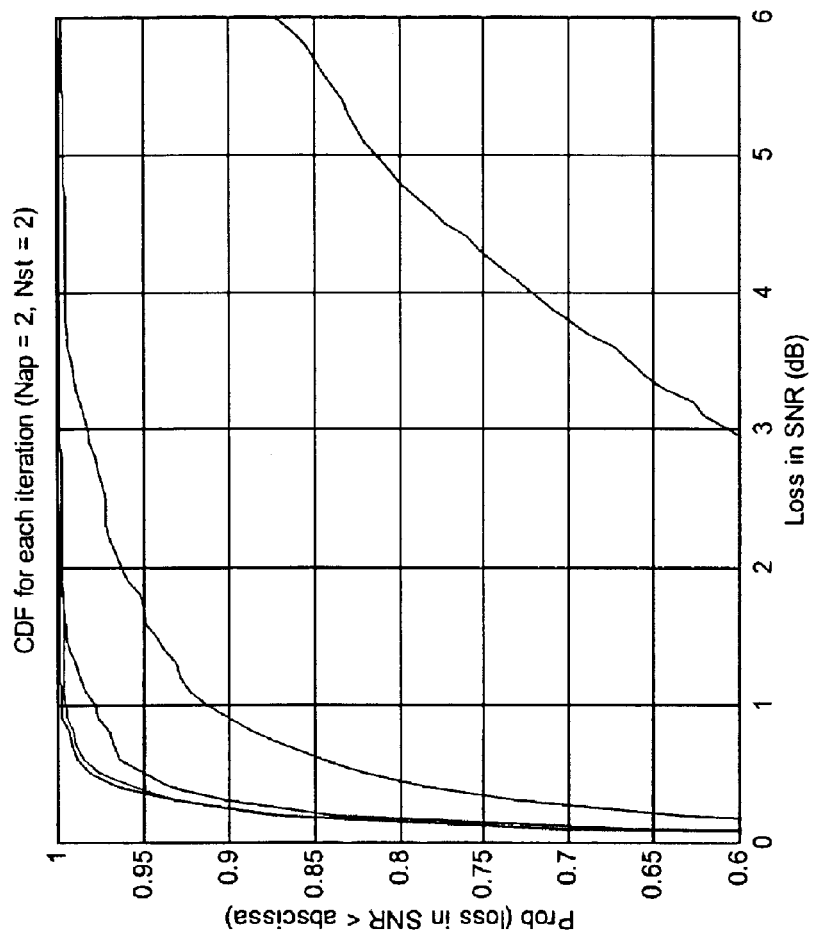
FIGS. 4 and 5 are graphical diagrams illustrating convergence properties of the adaptive method shown in FIG. 3.
Figure 5:
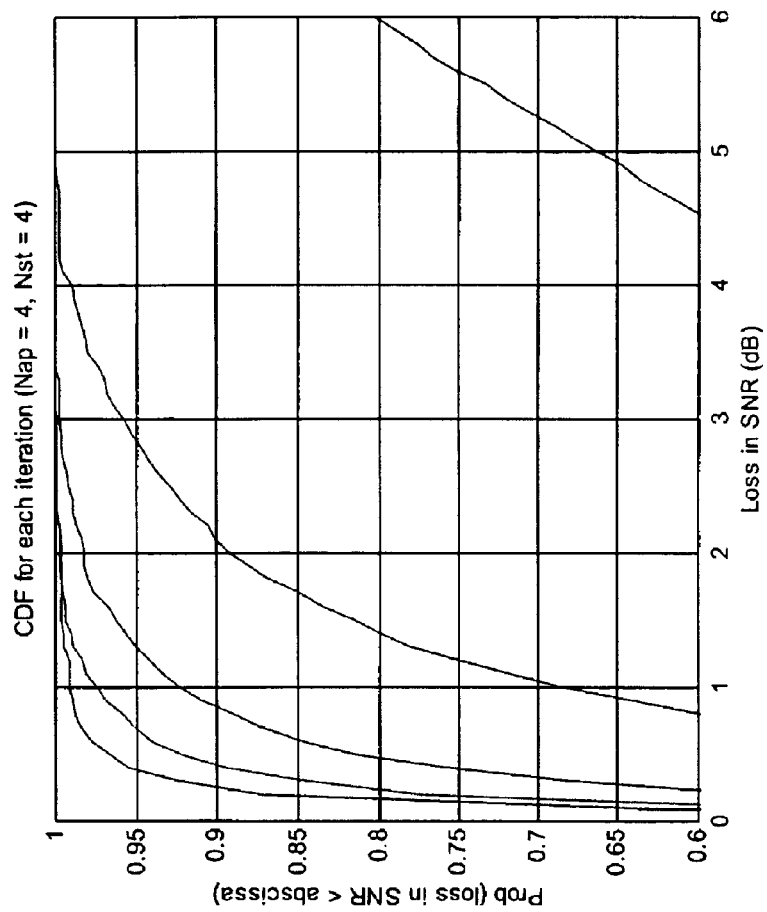

With reference to FIGS. 4 and 5, the convergence properties of the adaptive algorithm were studied over 1000 randomly generated channels. The average SNR at each receive antenna was set to 10 dB. The normalized antenna array gain at the output of the receive antenna array, $|Hw_{tx}|^2/\lambda_{max}(H^H H)$ is used to study the performance. In FIG. 4, (Nap=2, Nsta=2), it is shown that the adaptive algorithm loss is less than a 1 dB at the 3rd iteration with 95% probability. When the number of antenna elements is increased to four, only one additional iteration was required for the algorithm converge to less than 1 dB loss with 95% probability.

An advantage of adaptive composite beamforming is that no special training sequence is required for adaptation. In addition, no changes to existing protocols are necessary, and there is no impact on throughput. The antenna weights are updated when real information or data is transmitted between devices. Transmit and receive weight adaptation is the same regardless of whether CBF is implemented at both ends of the link However, if the destination device uses selection diversity the performance can be improved by estimating the channel response.

The indoor wireless channel is a frequency dependent channel. Due to multi-path propagation the signal arrives at the receiver with different delays. The different delays cause the channel transfer function to be frequency selective. Therefore, to account for these delays, the antenna weights need to be adjusted according to the frequency dependent characteristics of the channel transfer function between the transmitting device and the receiving device.

Solutions for optimum antenna processing in a frequency selective channel are described hereinafter. Between any two communication devices, the communication channel will have a frequency response depending on frequency selective fading conditions, etc. The channel transfer function H(f) describes the frequency response and is used to select the optimum antenna transmit and receive weights for communication between those terminals.

To understand the frequency selective situation, reference is again made to FIG. 1, where the frequency dependent Nsta by Nap transfer function between the first and communication device and the second communication devices is denoted by the H(f). The Nap by Nsta transfer function between the second communication device and the first communication device is $H^T(f)$. The transmit weights at the first and second communication devices are denoted by the Nap×1 vector $w_{tx,ap}(f)$ and the Nsta×1 vector $w_{tx,sta}(f)$, respectively.

$$w_{tx,ap}(f) = [w_{tx,ap,1}(f), w_{tx,ap,2}(f), \ldots w_{tx,ap,Nap}(f)]^T$$

$$w_{tx,sta}(f) = [w_{tx,sta,1}(f), w_{tx,sta,2}(f), \ldots w_{tx,sta,Nsta}(f)]^T$$

The receive weights at the first and second communication devices are denoted by the Nap×1 vector $w_{rx,ap}(f)$ and the Nsta×1 vector $w_{rx,sta}(f)$, respectively $$w_{rx,ap}(f) = [w_{rx,ap,1}(f), w_{rx,ap,2}(f), \ldots w_{rx,ap,Nap}(f)]^T$$

$$w_{rx,sta}(f) = [w_{rx,sta,1}(f), w_{rx,sta,2}(f), \ldots w_{rx,sta,Nsta}(f)]^T$$

The transmit and receive weights (only the first communication device-second communication device link is described below but the results apply in the reverse direction with appropriate change in notation) are computed by optimizing a cost function, C, with a constraint on the maximum transmit power. In a communication system, the ultimate goal is to reduce bit-error rate (BER).

However, optimization using the BER as a cost function is not always analytically feasible. Therefore, cost functions that implicitly reduce the BER are usually selected. The cost function also depends on the receiver structure. Selection of the cost function for different modulation schemes and receiver structures is discussed.

$$\min_{w_{tx,ap}, w_{rx,sta}} \int_{-1/2T}^{1/2T} C(H(f), w_{tx,ap}(f), w_{rx,sta}(f)) df,$$

$$\text{subject to } \int_{-1/2T}^{1/2T} |w_{tx,ap}(f)|^2 df \leq P_0$$

For a code division multiple access (CDMA) communication system, such as IEEE 802.11b, the receiver is assumed to be a RAKE receiver and the BER is a function of the SNIR (signal to noise+interference ratio) at the output of the RAKE receiver. Maximizing the SNIR at the output of the RAKE receiver minimizes the BER.

$$\max_{w_{tx,ap}, w_{rx,sta}} \int_{-1/2T}^{1/2T} SNIR(H(f), w_{tx,ap}(f), w_{rx,sta}(f)) df,$$

$$\text{subject to } \int_{-1/2T}^{1/2T} |w_{tx,ap}(f)|^2 df \leq P_0$$

For an orthogonal frequency division multiplex (OFDM) system, such as IEEE 802.11a, the receiver is a linear equalizer followed by a Viterbi decoder. Since the Viterbi decoder is a non-linear operator, optimizing the coded BER is very challenging. An alternative is to minimize the mean square error (MSE) at the output of the linear equalizer (note another possible approach is to minimize the uncoded BER).

$$\min_{w_{tx,ap}, w_{rx,sta}} \int_{-1/2T}^{1/2T} MSE(H(f), w_{tx,ap}(f), w_{rx,sta}(f)) df,$$

-continued $$\text{subject to } \int_{-1/2T}^{1/2T} |w_{tx,ap}(f)|^2 df \leq P_0$$

A single carrier modulation scheme, such as IEEE 802.11b, uses a decision feedback equalizer (DFE) at the receiver. The receiver is a non-linear receiver. The transmit, receive and feedback weights are computed jointly. This can be achieved by minimizing the MSE at the output of the DFE.

$$\min_{w_{tx,ap} w_{rx,sta} B} \int_{-1/2T}^{1/2T} MSE(H(f), w_{tx,ap}(f), w_{rx,sta}(f)) df,$$

$$\text{subject to } \int_{-1/2T}^{1/2T} |w_{tx,ap}(f)|^2 df \leq P_0$$

For all cases considered, the optimum transmit weights are given by $$w_{tx\_ap}(f) = p(f) e_{max}(H^H(f)H(f))$$

where $e_{max}$ is the eigenvector corresponding to the maximum eigenvalue of the matrix $H^H(f) H(f)$, where $p(f)$ is a weighting function that weights each individual frequency bin and is based on the cost function. Typically, the solution to $p(f)$ follows a waterpouring distribution.

For the linear equalizer case, the solution is given by $$p^2(f) = \sqrt{\frac{1}{\mu \frac{\sigma_s^2}{\sigma_n^2} \lambda_{\max}(f)} - \frac{1}{\frac{\sigma_s^2}{\sigma_n^2} \lambda_{\max}(f)}} \quad SNR = \frac{\sigma_s^2}{\sigma_n^2}$$

For the DFE case, the solution is $$p^2(f) = \frac{1}{\mu} - \frac{1}{\frac{\sigma_s^2}{\sigma_n^2} \lambda_{\max}(f)}$$

where $\mu$ is selected to satisfy the power constraint $$\int_{-1/2T}^{1/2T} p^2(f) df = P_0$$

An optimal solution for $p(f)$ requires knowledge of the channel and SNR at the receiver. A suboptimal solution is obtained by setting $p(f)$ to a constant, p, across frequency.

$$w_{tx\_ap}(f) = p \, e_{max}(H^H(f)H(f))$$

This is referred to herein as a frequency shaping constraint. To explain further, the frequency shaping constraint requires that at each frequency of the baseband signal to be transmitted (e.g., frequency sub-band or frequency sub-carrier k), the sum of the power of signals across all of the transmit antennas is equal to a constant value, $P_{tx}/K$. This constraint is useful to ensure that, in an iterative process between two communication devices, the transmit weights of the two devices will converge to optimal values. An additional benefit of this constraint is that the transmitting device can easily satisfy spectral mask requirements of a communication standard, such as IEEE 802.11x.

This solution does not require knowledge of the receiver SNR and simulations have shown that the loss in performance over the optimal solution is negligible. However, this solution requires knowledge of the channel response at the transmitter.

For the cost functions maximizing the SNIR or minimizing the MSE for a linear equalizer, the optimum receive weights are given by $$w_{rx,sta}(f) = R_{ss}^{-1}(f) v_{mf,sta}(f)$$

where $v_{mf,sta}(f)$ is matched to the received signal $$v_{mf,sta}(f) = H(f) w_{tx,ap}(f)$$

and $R_{ss}(f)$ is the correlation matrix defined as $$R_{ss}(f) = \sigma_s^2 H(f) w_{tx,ap}(f) w_{tx,ap}^H H^H(f) + \sigma_n^2 I$$

$$= \sigma_s^2 v_{mf,sta}(f) v_{mf,sta}^H(f) + \sigma_n^2 I$$

When the MSE of the DFE is the minimized, the optimum receive weights are given by $$w_{rx,sta}(f) = R_{ss}^{-1}(f) v_{mf,sta}(f)(1+B(f))$$

where $B(f)$ is the feedback filter.

The weights for the reverse link are similar to the forward link and is summarized below. The optimum transmit weights at the second communication are given by $$w_{tx\_sta}(f) = p(f) e_{max}(H^*(f)H^T(f))$$

and the suboptimal transmit weights are $$w_{tx\_sta}(f) = p \, e_{max}(H^*(f)H^T(f))$$

Similarly, the receive weights at the first communication device are given by $$w_{rx,ap}(f) = R_{aa}^{-1}(f) v_{mf,ap}(f)$$

where $$v_{mf,ap}(f) = H^T(f) w_{tx,sta}(f)$$

and for DFE case $$R_{aa}(f) = \sigma_s^2 v_{mf,ap}(f) v_{mf,ap}^H(f) + \sigma_n^2 I$$

$$w_{rx,ap}(f) = R_{xx}^{-1}(f) v_{mf,ap}(1+B(f))$$

In the presence of co-channel interference $R_{ss}(f)$ is given by $$R_{ss}(f) = \sigma_s^2 H(f) w_{tx,ap}(f) w_{tx,ap}^H(f) H^H(f) + \sum_{k \neq 0} \sigma_k^2 H_k(f) w_k(f) w_k^H(f) H_k^H(f) + \sigma_n^2 I$$

where the terms in the summation are the contribution due to the interferers. In this case, the optimum receive antenna weights minimize the contribution of the interferers and the noise. Therefore, in addition to diversity gain, optimum antenna combining at the receiver also provides interference suppression capability.

Figure 6:
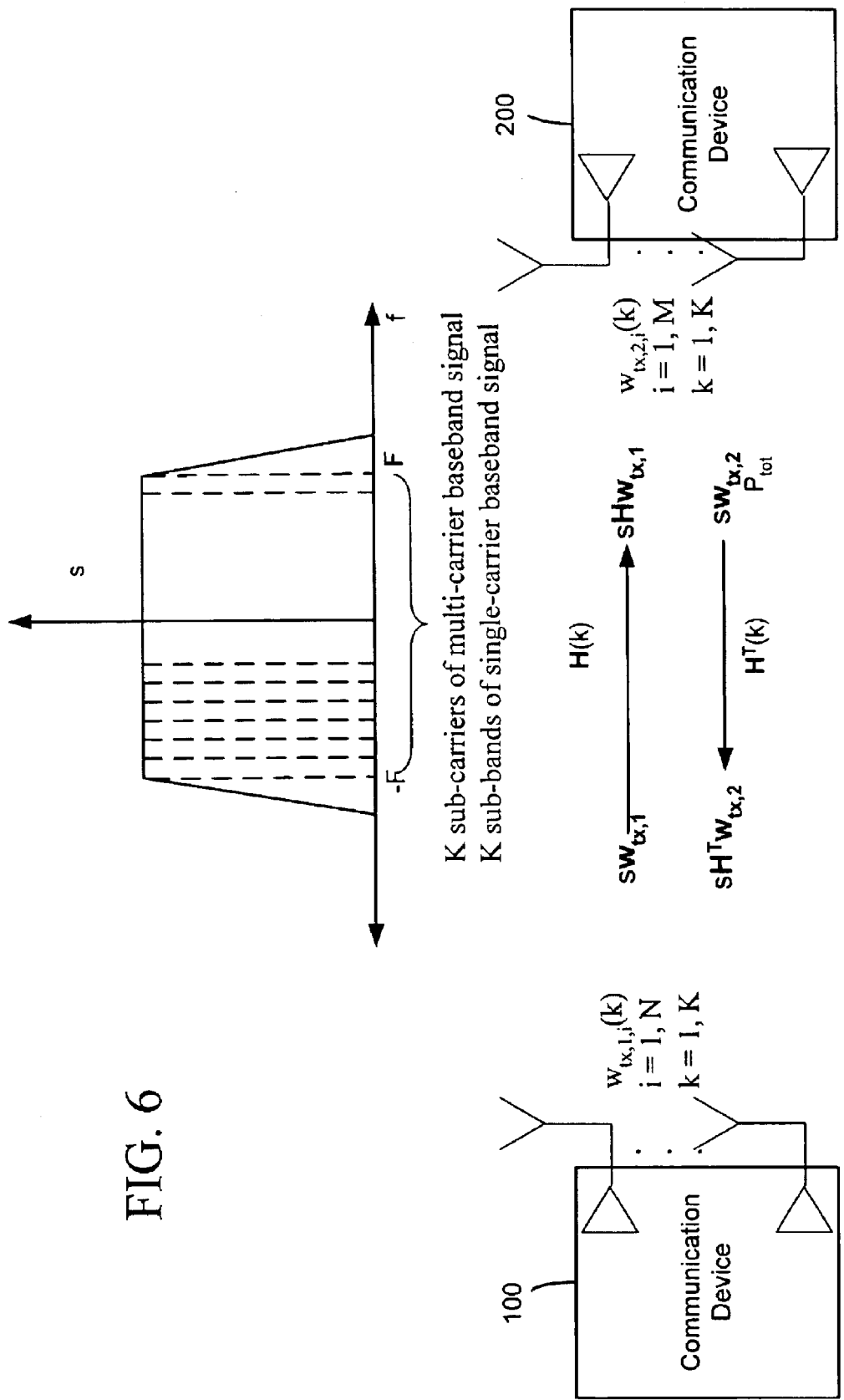
FIG. 6 is a diagram showing application of beamforming weights to a baseband signal for transmission in a frequency dependent communication channel.

FIG. 6 illustrates how frequency selective beamforming weights are applied to a baseband signal. The baseband signal may be a single carrier signal or a multi-carrier signal. In either case, the baseband signal will have a bandwidth or spectrum. According to the composite beamforming (CBF) technique described herein, when communication device 100 transmits a signal to communication device 200, it applies (i.e., multiplies or scales) a baseband signal s to be transmitted by a transmit weight vector associated with a particular destination device, e.g., communication device 200, denoted $w_{tx,1}$. Similarly, when communication device 200 transmits a baseband signal s to communication device 100, it multiplies the baseband signal s by a transmit weight vector $w_{tx,2}$, associated with destination communication device 100. The (M×N) frequency dependent channel matrix from the N plurality of antennas of the first communication device 100 to M plurality of antennas of the second communication device 200 is H(k), and the frequency dependent communication channel (N×M) matrix between the M plurality of antennas of the second communication device and the N plurality of antennas of the first communication device is $H^T(k)$. The variable k denotes the frequency dependent characteristic as explained further hereinafter.

The transmit weight vectors $w_{tx,1}$ and $w_{tx,2}$ each comprises a plurality of transmit weights corresponding to each of the N and M antennas, respectively. Each transmit weight is a complex quantity. Moreover, each transmit weight vector is frequency dependent; it varies across the bandwidth of the baseband signal s to be transmitted. For example, if the baseband signal s is a multi-carrier signal of K sub-carriers, each transmit weight for a corresponding antenna varies across the K sub-carriers. Similarly, if the baseband signal s is a single-carrier signal (that can be divided into K frequency sub-bands), each transmit weight for a corresponding antenna varies across the bandwidth of the baseband signal. Therefore, the transmit weight vector is dependent on frequency, or frequency sub-band/sub-carrier k, such that $w_{tx}$ becomes $w_{tx}(f)$, or more commonly referred to as $w_{tx}(k)$, where k is the frequency sub-band/sub-carrier index.

While the terms frequency sub-band/sub-carrier are used herein in connection with beamforming in a frequency dependent channel, it should be understood that the term "sub-band" is meant to include a narrow bandwidth of spectrum forming a part of a baseband signal. The sub-band may be a single discrete frequency (within a suitable frequency resolution that a device can process) or a narrow bandwidth of several frequencies.

The receiving communication device also weights the signals received at its antennas with a frequency dependent receive antenna weight vector $w_{rx}(k)$. Communication device 100 uses a receive antenna weight vector $w_{rx,1}(k)$ when receiving a transmission from communication device 200, and communication device 200 uses a receive antenna weight vector $w_{rx,2}(k)$ when receiving a transmission from communication device 100. The receive antenna weights of each vector are matched to the received signals by the receiving communication device.

Generally, transmit weight vector $w_{tx,1}$ comprises a plurality of transmit antenna weights $w_{tx,1,i} = \beta_{1,i}(k)e^{j\phi 1,i,(k)}$, where $\beta_{1,i}(k)$ is the magnitude of the antenna weight, $\phi 1,i,(k)$ is the phase of the antenna weight, i is the antenna index (up to N), and k is the frequency sub-band or sub-carrier index (up to K frequency sub-bands/sub-carriers). The subscripts tx,1 denote that it is a vector that communication device 100 uses to transmit to communication device 2. Similarly, the subscripts tx,2 denote that it is a vector that communication device 200 uses to transmit to communication device 100.

The frequency shaping constraint described above may be imposed on the transmit weights for each antenna. As mentioned above, the constraint requires that at each frequency of the baseband signal to be transmitted (e.g., frequency sub-band or frequency sub-carrier k), the sum of the power of signals across all of the transmit antennas ($|w_{tx,i}(k)|^2$ for i=1 to N) is equal to a constant value, $P_{tx}/K$.

The relationship between transmit and receive weights are summarized below: The optimum receive and transmit weights at the first communication device are related as follows.

$$w_{tx,ap}(f) = e\max(H^H(f)H(f)), \quad v_{mf,sta}(f) = H(f)w_{tx,ap}(f)$$

Similarly at the second communication device, the optimum receive and transmit weights are related as follows.

$$w_{tx,sta}(f) = e\max(H^*(f)H^T(f)), \quad v_{mf,ap}(f) = H^T(f)w_{tx,sta}(f)$$

Additionally, $$v_{mf,ap}(f) = w_{tx,ap}*(f), \quad v_{mf,sta}(f) = w_{tx,ap}*(f)$$

The properties outlined above can be utilized in an adaptive/iterative process 480 shown in FIG. 7 that is similar to the process shown in FIG. 3. The antenna weight parameters in FIG. 4 are written with indexes to reflect communication between an AP and a STA, but without loss of generality, it should be understood that this process is not limited to a WLAN application, and is useful in any wireless application, such as a short-range application. The AP has Nap antennas and the STA has Nsta antennas. Assuming the AP begins with the first transmission to the STA, the initial AP transmit weight vector $w_{T,AP,0}(k)$ is [1,1, . . . 1], normalized by $1/(\text{Nap})^{1/2}$ for all antennas and all frequency sub-bands/sub-carriers k. Phase for the transmit antenna weights are also initially set to zero. The index T indicates it is a transmit weight vector, index AP indicates it is an AP vector, index 0 is the iteration of the vector, and (k) indicates that it is frequency sub-band/sub-carrier dependent. In step 482, a baseband signal is scaled by the initial AP transmit weight vector $w_{T,AP,0}(k)$, upconverted and transmitted to the STA by the Nap antennas. The transmitted signal is effectively altered by the frequency selective channel matrix H(k) from AP-STA. The STA receives the signal and matches its initial receive weight vector $w_{R,STA,0}(k)$ to the signals received at its antennas. In step 484, the STA normalizes the receive weight vector $w_{R,STA,0}(k)$ and computes the conjugate of normalized receive weight vector to generate the STA's initial transmit weights for transmitting a signal back to the AP. In step 486, the STA processes the signal to be transmitted to the AP by the initial transmit weight vector, upconverts that signal and transmits it to the AP. The transmitted signal is effectively altered by the frequency selective channel matrix $H^T(k)$. At the AP, the receive weight vector is matched to the signals received at its antennas. The AP then computes the conjugate of the gain-normalized receive weight vector as the next transmit weight vector $w_{T,AP,1}(k)$ and transmits a signal to the STA with that transmit weight vector. The STA receives the signal transmitted from the AP with this next transmit weight vector and matches to the received signals to compute a next receive weight vector $w_{R,STA,1}(k)$. Again, the STA computes the conjugate of the gain-normalized receive weight vector $w_{R,STA,1}(k)$ as its next transmit weight vector $w_{T,STA,1}(k)$ for transmitting a signal back to the AP. This process repeats for several iterations as shown by steps 488 and 490, ultimately converging to transmit weight vectors that achieve nearly the same performance as non-equal gain composite beamforming. This adaptive process works even if one of the devices, such as a STA, has a single antenna for transmission and reception.

When storing the transmit weights of a frequency transmit weight vector, in order to conserve memory space in the communication device, the device may store, for each antenna, weights for a subset or a portion of the total number of weights that span the bandwidth of the baseband signal. For example, if there are K weights for K frequency sub-bands or sub-carrier frequencies, only a sampling of those weights are actually stored, such as weights for every other, every third, every fourth, etc., k sub-band or sub-carrier. Then, the stored subset of transmit weights are retrieved from storage when a device is to commence transmission of a signal, and the remaining weights are generated by interpolation from the stored subset of weights. Any suitable interpolation can be used, such as linear interpolation, to obtain the complete set of weights across the K sub-bands or sub-carriers for each antenna.

Figure 8:
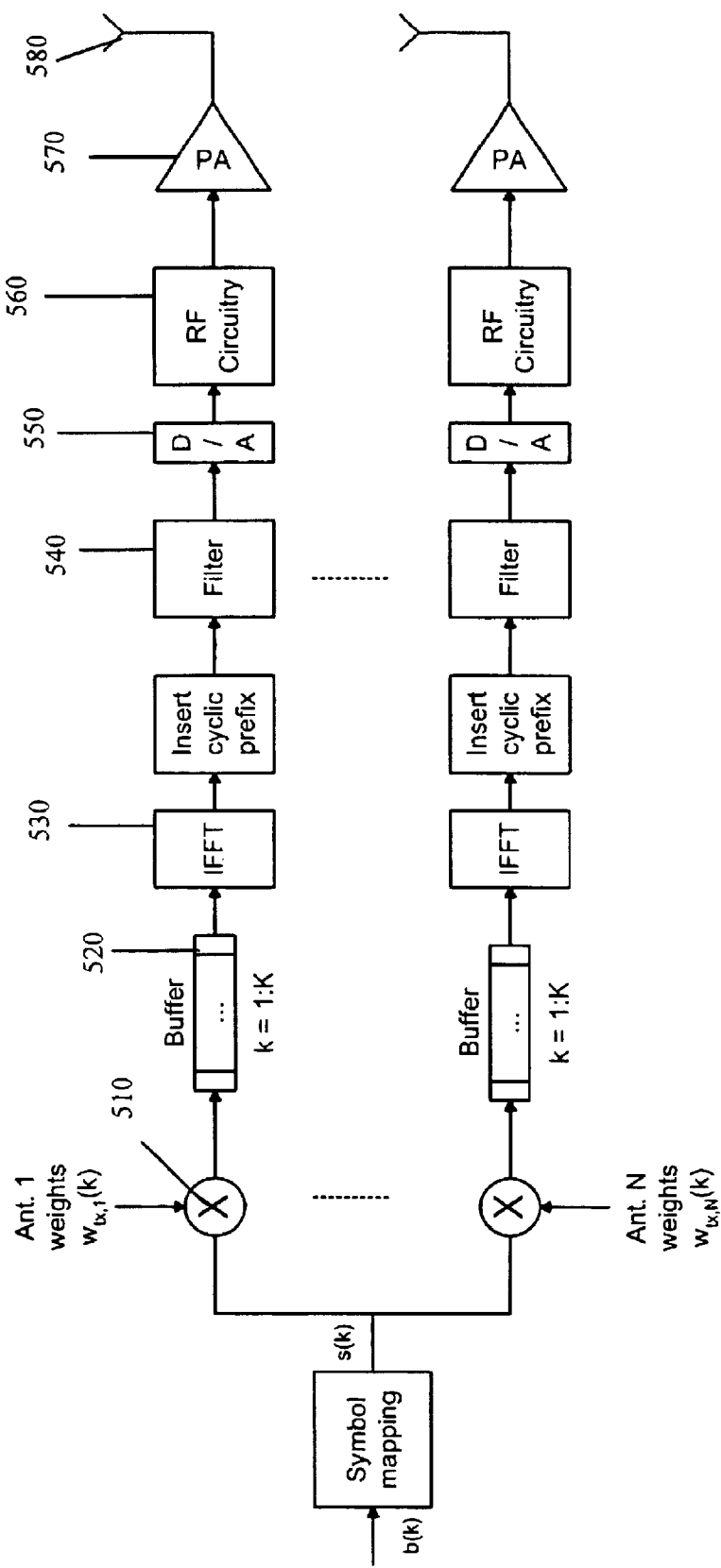
FIG. 8 is a block diagram of a composite beamforming transmission process for a multi-carrier baseband modulation scheme.

With reference to FIG. 8, a beamforming transmission process 500 is shown for a multi-carrier baseband modulation scheme. For an orthogonal frequency division multiplexed (OFDM) system used, for example, by the IEEE 802.11a standard, the data symbols are in the frequency domain. K symbols are assigned to K sub-carriers (K=52 for 802.11a). For convenience, each of the transmit antenna weights are described as a function of (k), the sub-carrier frequency. Each of the N antennas has a transmit antenna weight $w_{tx}$ that is a function of k, i.e., $w_{tx}(k)$ over k=1 to K. The transmit antenna weights are computed by any of the processes described above at each of the sub-carrier frequencies. There is a signal processing path for each of the N antennas. In each signal processing path, a multiplier 510 multiplies the frequency domain symbol s(k) by the corresponding transmit antenna weight $w_{tx}(k)$ and because $w_{tx}(k)$ has K values, there are K results from the multiplication process. The results are stored in a buffer 520 for k=1 to K. An inverse Fast Fourier Transform (IFFT) 530 is coupled to the buffer to convert the frequency domain results stored in buffer 520 to a digital time domain signal for each of the K sub-carriers. There is some adjustment made for cyclic prefixes caused by the OFDM process. A filter 540 provides lowpass filtering of the result of the IFFT process. The digital results of the filtering process are converted to analog signals by a D/A 550. The outputs of the D/A 550 are coupled to RF circuitry 560 that upconverts the analog signals to the appropriate RF signal which is coupled via a power amplifier (PA) 570 to one of the N antennas 580. In this manner, for each antenna 580, the signal s(k) is multiplied by respective transmit antenna weights whose values may vary as a function of the sub-carrier frequency k. The frequency shaping constraint described above can also be applied to the antenna weights.

Figure 9:
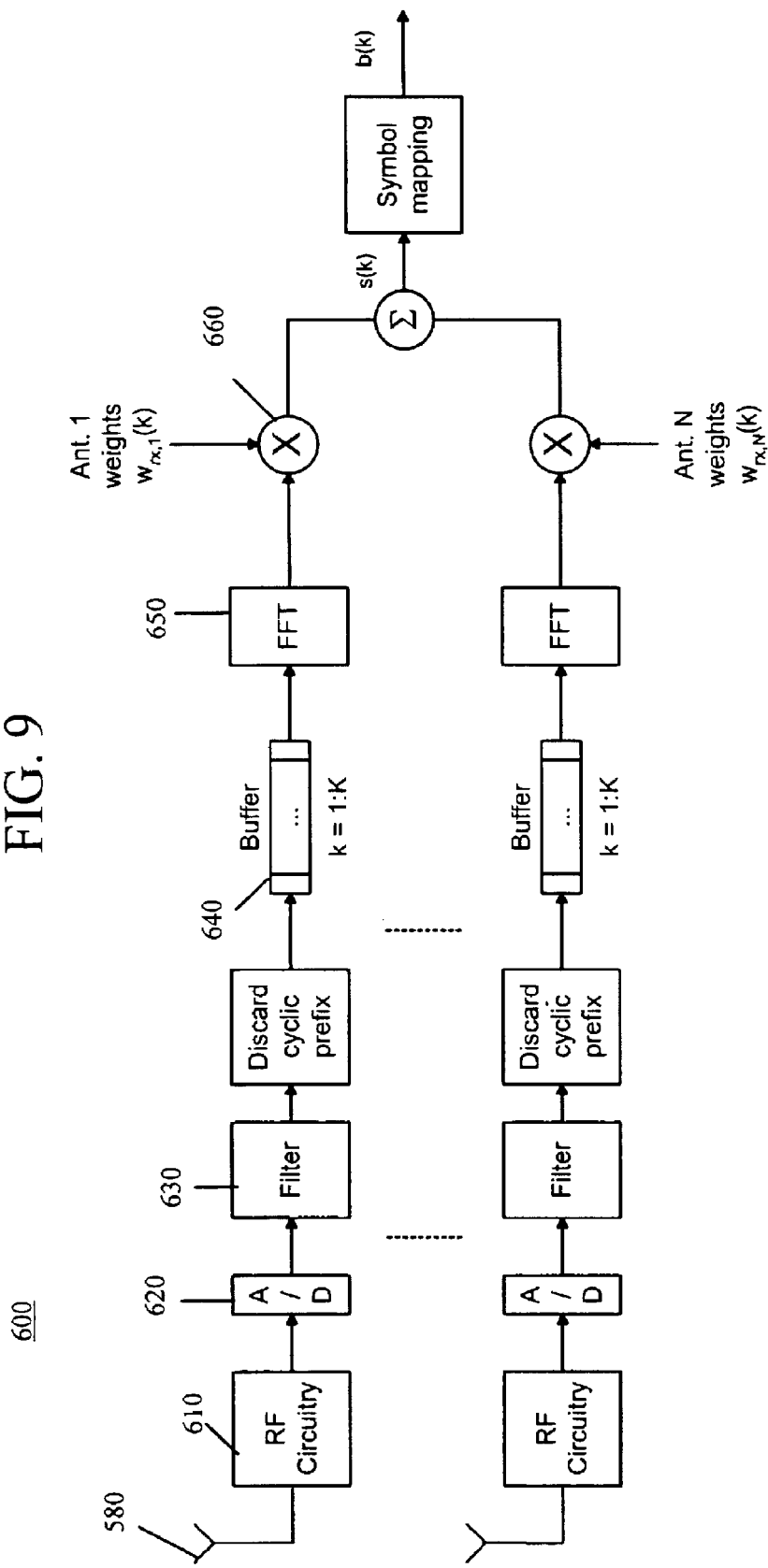
FIG. 9 is a block diagram of a composite beamforming reception process for a multi-carrier baseband modulation scheme.

FIG. 9 shows a beamforming reception process 600 that is essentially the inverse of the transmission process shown in FIG. 8. There is a signal processing channel for each of the antennas 580. RF circuitry 610 downconverts the RF signals detected at each antenna 580 for each of the sub-carriers. An A/D 620 converts the analog signal to a digital signal. A lowpass filter 630 filters the digital signal. There is some adjustment made for cyclic prefixes caused by the OFDM process. A buffer 640 stores the time domain digital signal in slots associated with each sub-carrier frequency k. An FFT 650 converts the time domain digital signal in buffer 640 to a frequency domain signal corresponding to each sub-carrier frequency k. The output of the FFT 650 is coupled to a multiplier 660 that multiplies the digital signal for each sub-carrier k by a corresponding receive antenna weight $w_{rx}(k)$ for the corresponding one of the N antennas. The outputs of each of the multipliers 660 are combined by an adder 670 to recover the digital frequency domain symbol s(k). The signal s(k) is then mapped back to symbol b(k).

Figure 10:
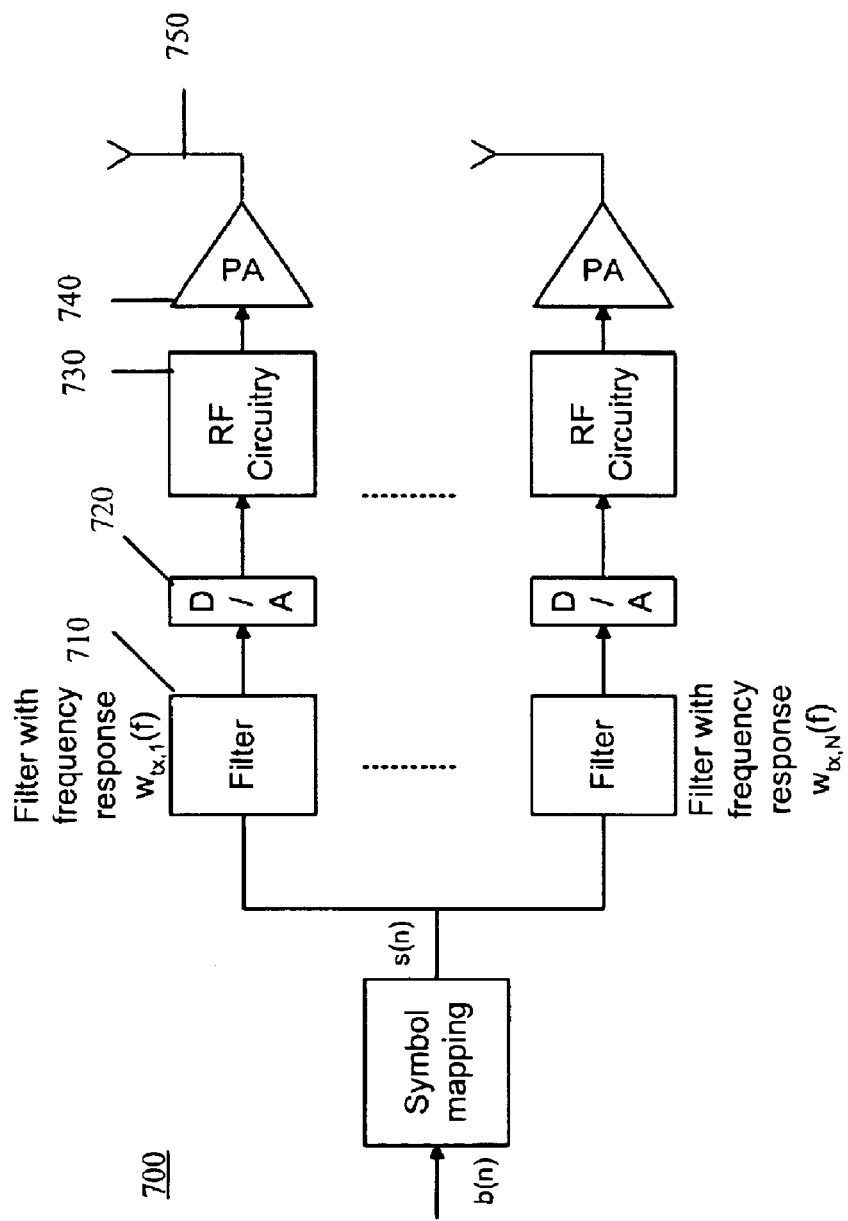
FIG. 10 is a block diagram of a composite beamforming transmission process for a single carrier baseband modulation scheme.
Figure 11:
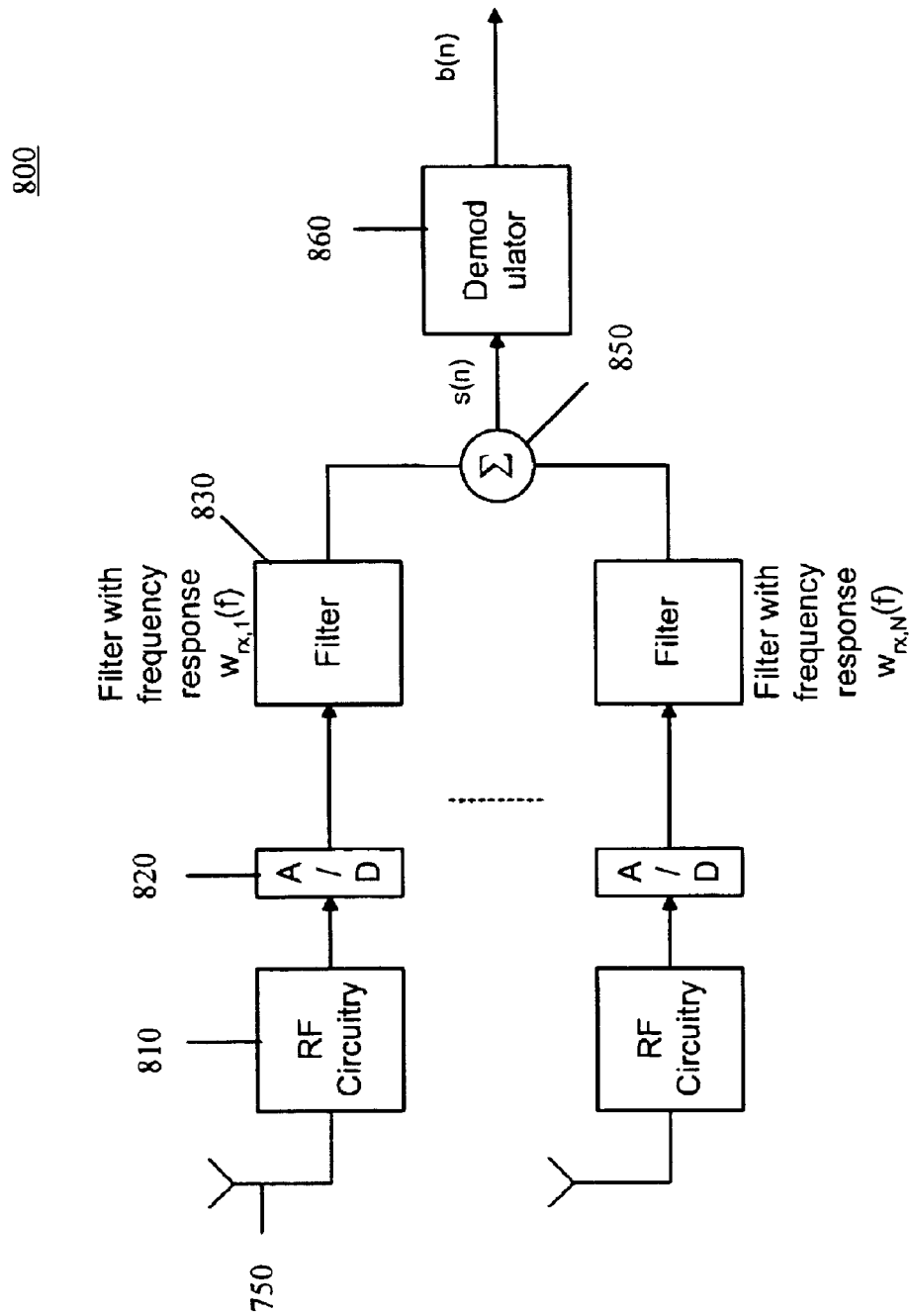
FIG. 11 is a block diagram of a composite beamforming reception process for a single carrier baseband modulation scheme.

FIGS. 10 and 11 show transmission and reception processes, respectively, for frequency dependent beamforming applied to a single carrier baseband modulation scheme, such as that used by the IEEE 802.11b standard. The data symbols in such a system are in the time domain. FIG. 10 shows a beamforming transmission process 700 suitable for a single carrier modulation scheme. Since in a frequency dependent channel, the transmit antenna weights are frequency dependent, the passband of the baseband signal is synthesized into frequency bins (K bins) and transmit beamforming weights are computed for each frequency bin using any of the processes described above. There are processing channels for each antenna. In each processing channel, transmit filters 710 are synthesized with the frequency response specified by the beamforming weights. Thus, each transmit filter 710 has a frequency response defined by the transmit antenna weight $wt_x(f)$ associated with that antenna. The data symbol s(n) is passed through the transmit filter 710 which in effect applies the frequency selective antenna weight to the data symbol s(n). The D/A 720 converts the digital output of the transmit filter 710 to an analog signal. The RF circuitry 730 upconverts the analog signal and couples the upconverted analog signal to an antenna 750 via a power amplifier 740. The frequency shaping constraint described above can also be applied to the antenna weights.

FIG. 11 shows a reception process 800 suitable for a single carrier modulation scheme. There is a processing channel for each antenna 750. In each processing channel, RF circuitry 810 downconverts the received RF signal. An A/D 820 converts the downconverted analog signal to a digital signal. Like the frequency dependent transmit antenna weights, the receive antenna weights are computed for several frequency sub-bands. Receive filters 830 are synthesized with the frequency response specified by the receive beamforming weights $w_{rx}(f)$ and the received digital signal is passed through filters 830 for each antenna, effectively applying a frequency dependent antenna weight to the received signal for each antenna. The results of the filters 830 are combined in an adder 850, and then passed to a demodulator 860 for demodulation.

Figure 12:
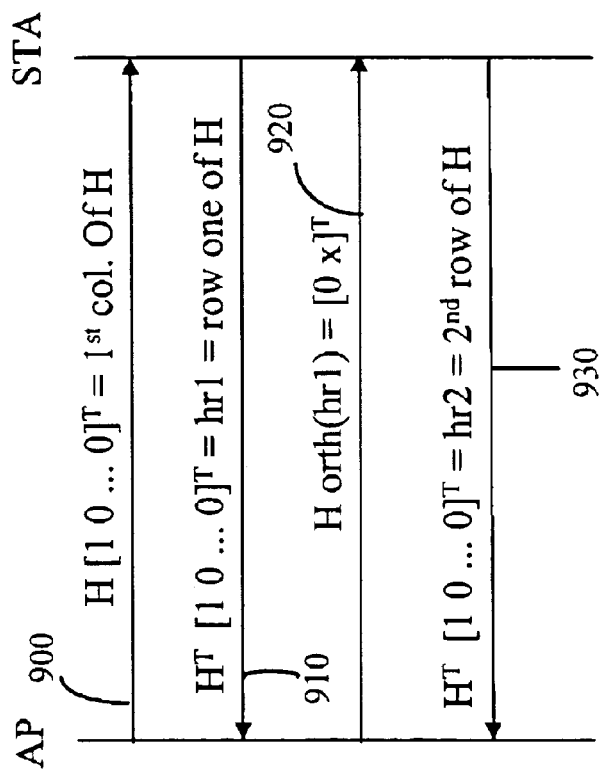
FIG. 12 is a flow chart of a beamforming training method where one communication device of a communication link uses antenna selection diversity.

Referring next to FIG. 12, a procedure is shown for use when only one of the two devices supports beamforming. For example, N-CBF is supported at a first communication device (an AP) but not at a second communication device (a STA). In this case, the STA is likely to support 2-antenna Tx/Rx selection diversity as discussed previously. If this is the case, it is possible for the AP to achieve 3 dB better performance than Nth order maximal ratio combining (MRC) at both ends of the link.

When the STA associates or whenever a significant change in channel response is detected, the AP sends a special training sequence to help the STA select the best of its two antennas. The training sequence uses messages entirely supported by the applicable media access control protocol, which in the following example is IEEE 802.11x.

The sequence consists of 2 data units (such as an IEEE 802.11 MSDU ideally containing data that is actually meant for the STA so as not to incur a loss in throughput). In step 900, the first communication device sends the first data unit using the Tx weight vector $[1\ 0\ \ldots\ 0]^T$. That is, the first communication device sends the first data unit exclusively by one of its N antennas. In step 910, the second communication device responds by transmitting a message using one of its' two antennas. The first device decodes the message from the second device, and obtains one row of the H matrix (such as the first row $h_{r1}$). In step 920, the first device sends the second MSDU using a weight vector which is orthogonal to the first row of H (determined in step 910). When the second device receives the second MSDU, in step 930, standard selection diversity logic forces it to transmit a response message in step 930 using the other antenna, allowing the first device to see the second row of the H matrix, $h_{r2}$. Now the first device knows the entire H matrix. The first device then decides which row of the H matrix will provide "better" MRC at the second device by computing a norm of each row, $h_{r1}$ and $h_{r2}$, of the H matrix and, and selecting the row that has the greater norm as the transmit weight vector for further transmissions to that device until another change is detected in the channel.

For the frequency sensitive case, the process shown in FIG. 11 is repeated at each of a plurality of frequency sub-bands that span the bandwidth of a single carrier baseband signal to be communicated between the devices, or at each of the sub-carrier frequencies of a multi-carrier baseband signal to be communication between the devices.

Figure 13:
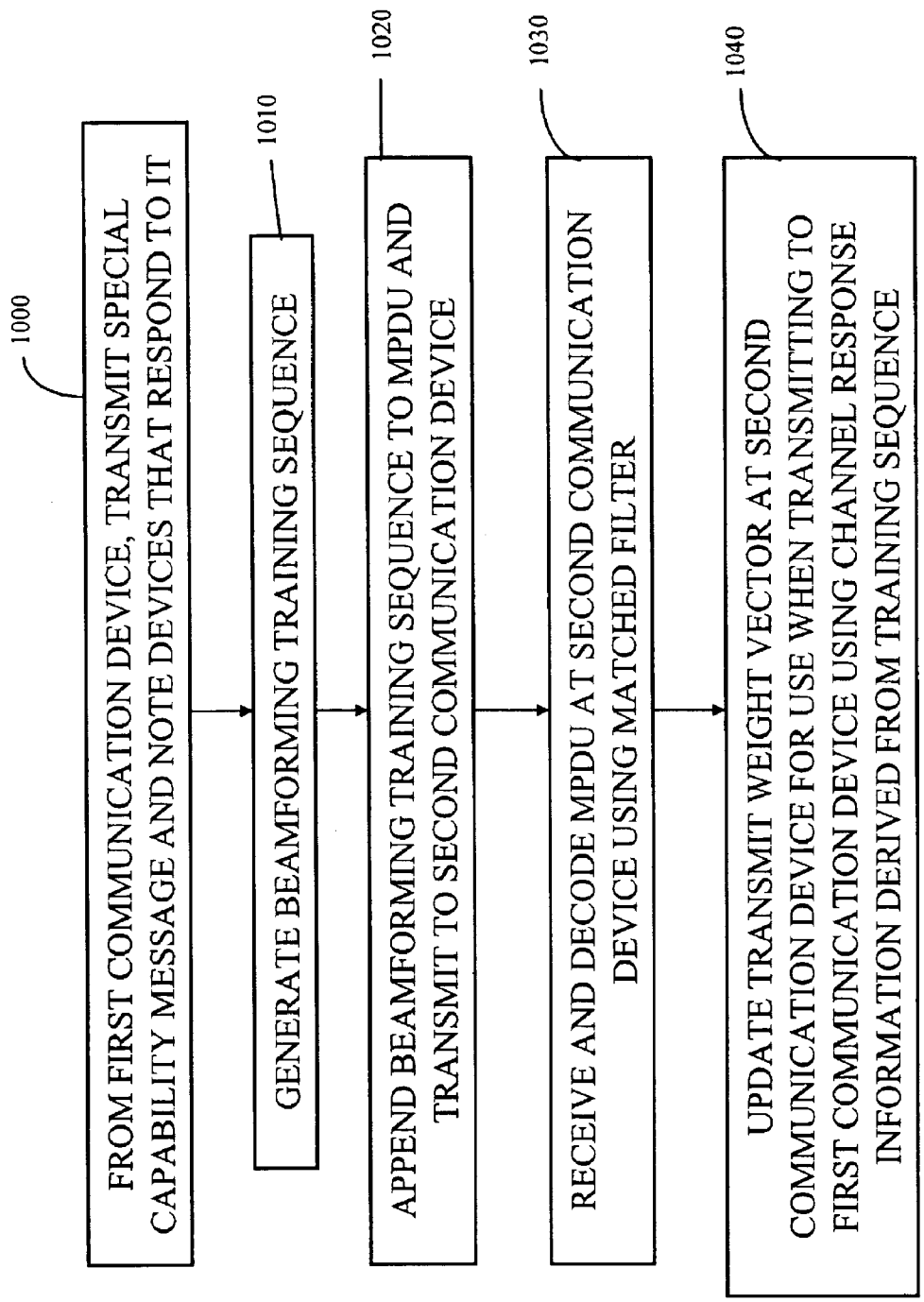
FIG. 13 is a flow chart illustrating a collaborative method to obtain antenna processing parameters for communication between first and second communication devices.

Turning to FIG. 13 with continued reference to FIG. 1, a method is described for a collaborative approach for maintaining channel response information at one communication device for transmission with another communication device. Initially, in step 1000, one communication device determines which other communication devices are CBF-capable using a special CBF-capability request message. For example, this message is sent by an AP whenever a new STA associates with the AP. Non-CBF-capable devices will not respond to the message since they will not recognize it without CBF capability. Once it has confirmed CBF capability, whenever a CBF-capable device (AP or STA) sends information to the other device, in step 1010, a CBF training sequence is generated and appended to a data unit. For example, in the context of IEEE 802.11x, when a directed media access control (MAC) Protocol Data Unit (MPDU) to another CBF-capable terminal, it appends a small (2*N orthogonal frequency division multiplexed (OFDM) symbols, N=the number of antennas of the transmitting device) CBF training sequence containing channel response information at the end of the MPDU data segment. For example, the CBF training sequence may comprise N consecutive 2-symbol long preamble sequences as defined in 802.11a. These N sequences are multiplied by respective ones of N linearly independent vectors that span the column matrix of the channel response matrix. Such N linearly independent vectors may be, for example, the transmitted using the transmit weight vectors $[1\ 0\ \ldots\ 0]^T, [1\ 0\ \ldots\ 0]^T, \ldots, [0\ 0\ \ldots\ 1]^T$. These vectors essentially cause individual sequences to be transmitted exclusively on separate ones of the antennas, and nevertheless produce a column vector of the channel response matrix H at the receiving terminal. The CBF training sequence is appended to the MPDU and transmitted to the destination communication device in step 1020. The transmitting terminal uses the optimum transmit weight vector when transmitting all other portions of the MPDU.

In step 1030, the destination device receives and decodes the normal portion of the incoming MPDU using a matched filter derived using the long preamble at the beginning of the incoming burst to determine the optimum phase and gain relationships on each receive antenna. Also, in step 1040, the destination device updates the transmit weight vector to use when transmitting to the source device (including the ACK to the incoming MPDU, for example) using the channel response matrix H derived from the CBF training sequence.

For example, suppose there are three antennas at the AP and two antennas at the STA. The CBF training sequence that the AP sends to the STA is transmitted using the transmit weight vectors $[1\ 0\ 0]^T, [0\ 1\ 0]^T$ and $[0\ 0\ 1]^T$. The channel response H vector between these two devices is a 2×3 matrix defined as $[h_{11}\ h_{12}]^T, [h_{21}\ h_{22}]^T$ and $[h_{31}\ h_{32}]^T$. When these transmit weight vectors are applied to the symbol s and transmitted, the result is $s[h_{11}\ h_{12}]^T, s[h_{21}\ h_{22}]^T$ and $s[h_{31}\ h_{32}]^T$. Therefore, the column vectors $[h_{11}\ h_{12}]^T, [h_{21}\ h_{22}]^T$ and $[h_{31}\ h_{32}]^T$ of the H matrix can be computed by dividing each receive vector ($[r_{11}\ r_{12}]^T, [r_{21}\ r_{22}]^T$ and $[r_{31}\ r_{32}]^T$, the receive output of the antennas at the STA) by s since the transmit symbol s is known at the STA because the STA will know the symbols used by the AP for the training sequence.

Using the method described above, a communication device may store the optimum transmit weight vectors for each of the other communication devices it communicates with. For example, an AP maintains a table mapping the MAC address for each STA to the optimum Tx weight vector for that STA. CBF-capable STAs may also store a table of such information when supporting communication in a peer-peer or ad-hoc network. All transmit weight vectors may be initially set to $[1\ 0\ \ldots\ 0]^T$.

For a 4-CBF scheme (4 antennas at the AP) using 1500 byte packets at 54 Mbps, the loss in throughput for the above approach is approximately 8%. The loss in throughput could be made smaller using the following enhancements: one symbol long preambles instead of 2 in the training sequence; use the channel response training sequence only when it is needed; and/or transmitting the training sequence during the IEEE 802.11 SIFS interval.

The training sequence scheme described above can be applied to generate frequency dependent antenna weights. Steps 1010 through 1030 are repeated for each of a plurality of frequencies. For example, in the multi-carrier signal case, steps 1010 through 1040 are repeated K times, for each sub-carrier frequency. Similarly, for a single carrier modulation scheme, the training sequence would be applied for each of a plurality of frequency sub-bands that span the bandwidth of the baseband signal to be transmitted. In addition, the transmit weights can be frequency shaped so that the sum of the power across all of the antennas at a given frequency is constant.

The antenna processing techniques described herein can be incorporated into devices in a variety of ways. For example, an RF chip can be built that supports 2 Tx/Rx antenna ports, and one baseband chip that supports 2× to 4×CBF. One RF chip together with one baseband chip can be used in a network interface card, and two RF chips together with one baseband chip can be used in an AP for a system that supports 4-CBF at an AP, and 2-CBF in a STA. This system will perform up to 12 dB better than current state-of-the-art system.

From simulations for 2-antenna selection diversity in an indoor office environment w/50 ns RMS delay spread, 8 dB (4 dB) SNR is required for 802.11a (802.11b) at the lowest data rate. Including 6 dB of additional path loss for 802.11a at 5 GHz, a total of 6+8−4=10 dB of additional received signal power is required for 802.11a. For a path loss coefficient of 3.3 (indoor environment), 10 dB of additional signal power corresponds to ½ the range.

In addition, the antenna processing schemes described herein help reduce the performance degradation caused by interference. It has been shown through simulations that the interference immunity for a CBF-enhanced 802.11b network is approximately 2.2 times that of a non-CBF network. In other words, a CBF enhanced communication between two devices permits an interference source to be 2.2 times close to a receiving device without degrading reception performance at that device.

To again summarize, the antenna processing techniques described above provide up to a 14 dB (25×) SNR improvement over existing 802.11a/b implementations without requiring a change to the communication protocol or standard. Moreover, compared to current 2-antenna implementations, these techniques provide nearly three times more range per AP; 7.3 times more coverage area; four times less infrastructure cost at a fixed throughput per user; 7–10 times less infrastructure cost when optimized for coverage; 5 times more throughput per user at a fixed infrastructure cost; normalized and improved range for dual-mode 802.11a/b networks; and better interference immunity and higher data rates. As much as 10 times fewer APs are required to support a similar coverage area when CBF-enhanced APs are used.

To summarize, a method is provided that accomplishes communication between a first communication device and a second communication device using radio frequency (RF) communication techniques, comprising steps of applying a transmit antenna vector to a baseband signal to be transmitted from the first communication device to the second communication device, the transmit antenna weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal; receiving at the N plurality of antennas of the first communication device a signal that was transmitted by the second communication device; determining a receive weight vector comprising a plurality of complex receive antenna weights for the N plurality of antennas of the first communication device from one or more signals received by the N plurality of antennas from the second communication device, wherein each receive antenna weight has a magnitude and a phase whose values may vary with frequency; and updating the transmit weight vector for the plurality of antennas of the first communication device for transmitting signals to the second communication device by computing a conjugate of the receive weight vector of the first communication device divided by a norm of the conjugate of the receive weight vector. This same method may be embodied in the form of instructions encoded on a medium or in a communication device.

Also provided is a method that accomplishes communication between a first communication device and a second communication device, comprising steps of transmitting a first signal by one of N plurality of antennas of the first communication device; receiving a first response signal at the plurality of antennas of the first communication device transmitted from a first of two antennas of the second communication device; deriving a first row of a channel response matrix that describes the channel response between the first communication device and the second communication device; transmitting a second signal by the plurality of antennas of the first communication device using a transmit weight vector that is orthogonal to the first row of the channel response matrix; receiving a second response signal transmitted by a second of the two antennas of the second communication device and deriving therefrom a second row of the channel response matrix; and selecting one of the first and second rows of the channel response matrix that provides better signal-to-noise at the second communication device as the transmit weight vector for further transmission of signals to the second communication device. This same method may be embodied in the form of instructions encoded on a medium or in a communication device.

Still further provided is a method that accomplishes communication between first and second communication devices comprising steps of generating a training sequence comprising a sequence of N consecutive symbols, where N is a number of antennas of the first communication device, and the N symbols are multiplied by respective ones of N linearly independent vectors that span columns of a channel response matrix between the plurality of antennas of the first communication device and a plurality of antennas of the second communication device, thereby producing N transmit signals; transmitting the N transmit signals from the plurality of antennas of the first communication device; receiving the N transmit signals at each of a plurality of antennas at the second communication device; at the second communication device, deriving from signals received by the plurality of antennas the channel response matrix between the first communication device and the second communication device; and at the second communication device, generating a transmit weight vector from the channel response matrix for transmitting a signal from the second communication device to the first communication device using the plurality of antennas of the second communication device. This same method may be embodied in the form of instructions encoded on a medium or in a communication device.

The above description is intended by way of example only.

What is claimed is:

1. A radio communication device comprising:
   a. N plurality of antennas;
   b. a baseband signal processor that generates transmit signals and that recovers data from receive signals; and
   c. a radio transceiver coupled to the baseband signal processor that upconverts the transmit signals for transmission via N plurality of antennas and downconverts signals received by the N plurality of antennas to produce receive signals;
   d. wherein the baseband signal processor applies a transmit antenna vector to weight a baseband signal to be transmitted simultaneously from each of N plurality of antennas, the transmit antenna weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal such that at substantially all frequencies of the baseband signal, the sum of the power of the transmit signals across the N plurality of antennas is equal to a constant.

2. The device of claim 1, wherein the baseband signal processor further determines a receive weight vector from signals received from another communication device by the N plurality of antennas, and updates the transmit weight vector for the N plurality of antennas for transmitting signals to the other communication device by computing a conjugate of the receive weight vector divided by a norm of the conjugate of the receive weight vector, using the updated transmit weight vector when next transmitting to the other communication device.

3. The device of claim 2, wherein the baseband signal processor updates the transmit weight vector each time a signal is received from the other communication device and over time converging to a transmit weight vector that optimize a signal-to-noise ratio for communication with the other communication devices.

4. The device of claim 3, wherein the baseband signal processor stores optimum transmit antenna weights indexed against an identifier for the other communication device.

5. The device of claim 1, wherein the baseband signal processor generates the transmit weight vector for each of K frequency sub-bands or sub-carriers of the baseband signal that correspond to sub-carriers of a multi-carrier baseband signal or to synthesized frequency sub-bands of a single carrier baseband signal.

6. The device of claim 5, wherein the baseband signal processor stores, for each of the N antennas, complex transmit antenna weights for a subset of the K frequency sub-bands or sub-carriers.

7. The device of claim 6, wherein the baseband signal processor retrieves the stored subset of complex transmit antenna weights and generates therefrom the complete set of antenna weights for all of the K frequency sub-bands or sub-carriers using interpolation techniques.

8. A wireless local area network access point device comprising the device of claim 1.

9. A radio communication system of claim 1, and further comprising a second radio communication device that comprises:

a. at least one antenna;

b. a baseband signal processor that generates a transmit signal and that recovers data from receive signals; and c. a radio transceiver coupled to the baseband signal processor that upconverts the transmit signal for transmission via the antenna and that downconverts a signal received by the antenna.

10. The system of claim 9, wherein the second communication device comprises M plurality of antennas, and wherein the baseband signal processor determines a receive weight vector comprising complex receive weights for each of the M plurality of antennas from the N transmit signals received by the M plurality of antennas, wherein each receive antenna weight has a magnitude and phase whose values may vary with frequency across a bandwidth of a baseband signal derived from the N transmit signals received by the second communication device; computes a transmit weight vector comprising a plurality of complex transmit antenna weights for the M plurality of antennas by computing a conjugate of the receive weight vector divided by the norm of the receive weight vector; and applies the transmit weight vector to a baseband signal to be transmitted from the second communication device to the other communication device, thereby generating M plurality of transmit signals such that at substantially all frequencies of the baseband signal, the sum of the power of the transmit signals across the M plurality of antennas is equal to a constant.

11. A method for communicating signals from a first communication device to a second communication device using radio frequency (RF) communication techniques, comprising:

a. applying a transmit antenna vector to a baseband signal to be transmitted from the first communication device to the second communication device, the transmit antenna weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal such that at substantially all frequencies of the baseband signal, the sum of the power of the transmit signals across the N plurality of antennas of the first communication device is equal to a constant; and b. transmitting the N plurality of transmit signals from the N plurality of antennas to the second communication device.

12. The method of claim 11, and further comprising the steps of receiving at the N plurality of antennas of the first communication device one or more signals transmitted by the second communication device; determining a receive weight vector from the one or more signals received from the second communication device by the N plurality of antennas; and updating the transmit weight vector for the N plurality of antennas of the first communication device for transmitting signals to the second communication device by computing a conjugate of the receive weight vector of the first communication device divided by a norm of the conjugate of the receive weight vector.

13. The method of claim 11, and further comprising repeating the step of updating each time one or more signals are received from the second communication device and over time converging to a transmit weight vector that optimizes a signal-to-noise ratio for communication with the second communication device.

14. The method of claim 11, and further comprising storing in the first communication device transmit antenna weights indexed against an identifier for the second communication device.

15. The method of claim 11, wherein the step of applying is performed for each of K frequency sub-bands of the baseband signal that correspond to sub-carriers of a multi-carrier baseband signal or to synthesized frequency sub-bands of a single carrier baseband signal.

16. The method of claim 15, and further comprising storing in the first communication device, for each of the N antennas, complex transmit antenna weights for a subset of the K frequency sub-bands or sub-carriers.

17. The method of claim 15, and further comprising retrieving the stored subset of complex transmit antenna weights and generating therefrom the complete set of antenna weights for all of the K frequency sub-bands or sub-carriers using interpolation techniques.

* * * * *

UNITED STATES PATENT AND TRADEMARK OFFICE
CERTIFICATE OF CORRECTION

PATENT NO. : 6,965,762 B2
APPLICATION NO. : 10/695229
DATED : November 15, 2005
INVENTOR(S) : Sugar et al.

It is certified that error appears in the above-identified patent and that said Letters Patent is hereby corrected as shown below:

IN THE ABSTRACT

At line 6, after the word "each", insert --of--.

At line 10, after the word "for", delete "the".

IN THE SPECIFICATION

At column 1, line 60, after the word "communication", insert therefor --device--.

At column 6, line 3, after the word "first", delete "and".

At column 8, line 16, after the word "is", delete "the".

At column 8, line 42, delete "$w_{rx,ap}(f) = R_{xx}^{-1} (f)v_{mf,ap}(1+B(f))$" and insert therefor -- $w_{rx,ap}(f)= R_{xx}^{-1} (f)v_{mf,ap} (f)(1+B(f))$ --.

At column 9, lines 14-15, after the word "each", delete "comprises" and insert therefor --comprise--.

At column 9, line 56, after the word "device", delete "2" and insert therefor --200--.

At column 12, line 60, after the word "of", delete "its' " and insert therefor --its--.

At column 13, line 5, after the word "matrix", delete "and".

At column 13, line 14, after the word "be", delete "communication" and insert therefor --communicated--.

At column 13, line 41, after the word "example", delete "the".

UNITED STATES PATENT AND TRADEMARK OFFICE
CERTIFICATE OF CORRECTION

PATENT NO.        : 6,965,762 B2
APPLICATION NO. : 10/695229
DATED             : November 15, 2005
INVENTOR(S)       : Sugar et al.

It is certified that error appears in the above-identified patent and that said Letters Patent is hereby corrected as shown below:

At column 14, line 46, after the word "state-of-the-art", delete "system" and insert therefor --systems--.

At column 14, line 61, after the word "times", delete "close", and insert therefor --closer--.

Signed and Sealed this

Second Day of October, 2007

JON W. DUDAS
*Director of the United States Patent and Trademark Office*